(12) United States Patent
Kim

(10) Patent No.: US 8,017,992 B2
(45) Date of Patent: Sep. 13, 2011

(54) FLASH MEMORY DEVICE AND METHOD OF FABRICATING THE SAME

(75) Inventor: Jae Heon Kim, Cheorwon-gun (KR)

(73) Assignee: Hynix Semiconductor Inc., Icheon-si (KR)

( * ) Notice: Subject to any disclaimer, the term of this patent is extended or adjusted under 35 U.S.C. 154(b) by 130 days.

(21) Appl. No.: 12/495,291

(22) Filed: Jun. 30, 2009

(65) Prior Publication Data

US 2010/0044774 A1 Feb. 25, 2010

(30) Foreign Application Priority Data

Aug. 21, 2008 (KR) .................. 10-2008-0081740

(51) Int. Cl.
 *H01L 29/788* (2006.01)
(52) U.S. Cl. ........ 257/321; 257/314; 257/315; 257/326; 257/E29.003
(58) Field of Classification Search .................. 257/314, 257/326, 321, 315, E29.003
See application file for complete search history.

(56) References Cited

U.S. PATENT DOCUMENTS

| 6,593,190 B2 * | 7/2003 | Lee et al. ...................... 438/262 |
| 6,627,931 B1 * | 9/2003 | Casagrande et al. .......... 257/295 |
| 7,339,233 B2 * | 3/2008 | Takahashi ..................... 257/324 |
| 2008/0014734 A1 * | 1/2008 | Hong et al. ................... 438/597 |

FOREIGN PATENT DOCUMENTS

| JP | 2006-332664 A | 12/2006 |
| KR | 10-2003-0008991 | 1/2003 |
| KR | 10-2005-0061766 | 6/2005 |
| KR | 100751663 | 8/2007 |

* cited by examiner

*Primary Examiner* — Lynne A. Gurley
*Assistant Examiner* — Trang Q Tran
(74) *Attorney, Agent, or Firm* — Marshall, Gerstein & Borun LLP

(57) ABSTRACT

Disclosed here in is a flash memory device and a method of fabricating the same. In accordance with one aspect of the invention, a flash memory device includes first contact plugs formed over a semiconductor substrate between gate patterns. Second contact plugs are formed over the semiconductor substrate between gate patterns and disposed alternately with the first contact plugs. The second contact plugs having a height greater than the first contact plugs. First and second conductive pads are connected to the first contact plugs. First and second pad contact plugs are formed on extended edge portions of the first and second conductive pads. First bit lines are connected to the first and second pad contact plugs, and second bit lines are connected to the second contact plugs.

12 Claims, 21 Drawing Sheets

FLASH MEMORY DEVICE AND METHOD OF FABRICATING THE SAME

CROSS-REFERENCES TO RELATED APPLICATIONS

Priority to Korean patent application No. 10-2008-0081740, filed on Aug. 21, 2008, the disclosure of which is incorporated herein by reference in its entirety, is claimed.

BACKGROUND OF THE INVENTION

1. Field of the Invention

The invention relates to a flash memory device and a method of fabricating the same, and, more particularly, to a flash memory device and a method of fabricating the same, which can prevent the occurrence of a bridge between contact plugs and improve a gap-fill characteristic of the contact plugs.

2. Brief Description of Related Technology

In recent years, active research has been performed to increase the integration and improve the performance of semiconductor memory devices. Problems resulting from the increased integration of semiconductor memory devices are described in detail with reference to NAND flash memory devices, as an example only. NAND flash memory devices advantageously have increased integration and a low manufacturing unit cost.

A NAND flash memory device consists of a plurality of cell strings. Each cell string includes a source select transistor, a plurality of memory cells, and a drain select transistor, which are connected in series. The source of the source select transistor is coupled to a common source line, and the drain of the drain select transistor is coupled to a bit line. Gates of the source select transistors are connected to form a source select line, gates of the drain select transistors are connected to form a drain select line, and gates of the memory cells are connected to form a word line.

A gate pattern, including the word line, the source select line, and the drain select line, has a structure in which a tunnel dielectric layer, a floating gate, a dielectric layer, and a control gate are sequentially stacked. A contact hole, which exposes the floating gate, is formed in the dielectric layer of the drain select line and the source select line. The floating gate is electrically connected to the control gate through the contact hole.

A lower structure of the flash memory device including the gate pattern is covered with an insulating layer to isolate it from an upper structure, which includes the common source line and the bit line. The lower structure is electrically connected to the upper structure by a contact plug formed within a contact hole formed in the insulating layer.

As a result of the increased integration of memory devices and the miniaturization of cell size, the critical dimension (CD) of a contact hole has decreased, and the process margin for forming the contact hole has become insufficient. A drain contact plug of a flash device is conventionally formed by forming a plurality of string structures, each including a source select transistor, a plurality of memory cells, and a drain select transistor in a semiconductor substrate. A source contact plug is formed, a pre-metal dielectric layer is formed over the source contact plug, and a contact hole that exposes the drain of the drain select transistor is formed. Next, tungsten (W) is deposited on the pre-metal dielectric layer including the contact hole and then polished, thereby forming a drain contact plug to gap-fill the contact hole.

A bowing phenomenon, in which a width of an intermediate depth of the contact hole is widened, can occur during formation of the drain contact hole when a bottom CD of the drain contact hole is secured to a certain level. The bowing phenomenon is a result of the pre-metal dielectric layer etched to form the drain contact being too thick. However, in a conventional method, this thickness is needed to secure the bottom CD of the drain contact hole. At the time of a subsequent wet cleaning process, the contact holes are connected where the bowing has occurred, which causes contact plugs formed within the contact holes to be connected, resulting in formation of a bridge.

Conventional methods of forming the contact holes to prevent an inter-hole bridge disadvantageously result in contact holes that are too small, and an increased aspect ratio. Accordingly, gap-fill failure of the contact plug, such as a void, is generated, causing an electrical short.

An inter-hole bridge can also result after gap-filling the contact hole with a pre-metal dielectric layer, during a wet cleaning process for removing micro defect materials formed during deposition of the pre-metal dielectric layer. This problem does not lie in a bridge occurring over the holes and is not detected upon in-line testing, making it difficult to detect this problem.

BRIEF SUMMARY OF THE INVENTION

Disclosed herein is a flash memory device and a method of fabricating the same, in which, a bridge can be prevented from occurring between the contact plugs and a gap-fill characteristic of the contact plugs can also be improved.

According to one embodiment, a flash memory device includes first contact plugs formed over a semiconductor substrate between gate patterns, and second contact plugs formed over the semiconductor substrate between the gate patterns and disposed alternately with the first contact plugs. The second contact plugs have a height greater than a height of the first contact plugs. First and second conductive pads are connected to the first contact plugs. The first and second pad contact plugs are formed on extended edge portions of the first and second conductive pads. First bit lines connected to the first and second pad contact plugs, and second bit lines are connected to the second contact plugs.

The flash memory device can further include a first insulating layer in which first contact holes are formed to define areas in which the first contact plugs are to be formed, a second insulating layer in which first and second pad holes are formed to define areas in which the first and second conductive pads are to be formed, and a third insulating layer in which first and second pad contact holes are formed to define areas in which the first and second pad contact plugs are to be formed.

The second contact plugs can be formed within second contact holes that extend through the first, second, and third insulating layers.

The flash memory device can further include a spacer on sidewalls of any one of the first contact holes, the second contact holes, the first pad contact holes, and the second pad contact holes. The spacer is preferably formed of material having an etch selectivity different from that of the first, second, and third insulating layers. For example, the spacer can be formed of nitride-based material.

The first and second contact plugs are connected to drain junctions formed on the semiconductor substrate between the gate patterns.

The first contact plugs and the first and second conductive pads can be formed separately or integrally.

Accordingly to one embodiment, a method of fabricating a flash memory device includes providing a semiconductor substrate having gate patterns, first and second junctions formed between the gate patterns, and a first insulating layer covering the gate patterns. The method also includes forming first contact plugs within the first insulating layer, the first contact plugs being connected to the first junctions. The method further includes forming a second insulating layer including first and second conductive pads on the first contact plugs and the first insulating layer, the first and second conductive pads being connected to the first contact plugs. Still further, the method includes forming a third insulating layer on the first and second conductive pads and the second insulating layer. The method also includes forming second contact plugs within the first, second, and third insulating layer, and at the same time, forming first and second pad contact plugs connected to extended edge portions of the first and second conductive pads within the third insulating layer. The second contact plugs are connected to the second junctions and disposed alternately with the first contact plugs. The method also includes forming first and second bit lines, wherein the first bit lines are connected to the first and second pad contact plugs and cross the gate patterns, and the second bit lines are connected to the second contact plugs and disposed alternately with the first bit lines.

The method can include providing a semiconductor substrate having gate patterns that form drain select lines.

The method can further include forming first and second conductive pads alternately and extending in opposite directions. The first and second conductive pads can intersect the gate patterns and extend over word lines. A width of a portion of the first and second conductive pads connected to the first and second pad contact plugs can be greater than a width of a portion of the first and second conductive pads connected to the first contact plugs.

The method can also include forming a second contact plug to a height that is substantially equal to a sum of a height of the first contact plug, a height of the first or second conductive pads, and a height of the first or second pad contact plugs.

The method can further include forming first contact holes within the first insulating layer to define areas in which the first contact plugs will be formed, and forming a first spacer on sidewalls of the first contact holes before forming the first contact plugs.

The method of can also further include forming second contact holes within the first, second, and third insulating layers to define areas in which the second contact plugs will be formed, and, at the same time, forming first and second pad contact holes within the third insulating layer to define areas in which the first and second pad contact holes will be formed, and forming a second spacer on sidewalls of the second contact holes and the first and second pad contact holes before forming the second contact Accordingly to another embodiment, a method of fabricating a flash memory device includes providing a semiconductor substrate having gate patterns, and first and second junctions formed between gate patterns. The method also includes sequentially forming first and second insulating layers over the semiconductor substrate. The method further includes forming first and second pad holes to expose the first insulating layer corresponding to the first junctions. Still further, the method includes forming first contact holes to expose the first junctions through the exposed first insulating layer. The method also includes forming first contact plugs within the first contact holes, and, at the same time, forming first and second conductive pads within the first and second pad holes. The method also includes forming a third insulating layer on the first and second conductive pads. The method further includes forming second contact plugs within the first, second, and third insulating layer, wherein the second contact plugs are connected to the second junctions and disposed alternately with the first contact plugs, and at the same time, forming first and second pad contact plugs within the third insulating, the first and second contact plugs being connected to extended edge portions of the first and second conductive pads. The method also includes forming first and second bit lines, wherein the first bit lines are connected to the first and second pad contact plugs and cross the gate patterns, and the second bit lines are connected to the second contact plugs and disposed alternately with the first bit lines.

The method can further include forming a first spacer on sidewalls of the first contact holes and the first and second pad holes before forming the first contact plugs.

The method can also further include forming second contact holes within the first, second, and third insulating layers to define areas in which the second contact plugs will be formed, and, at the same time, forming first and second pad contact holes within the third insulating layer to define areas in which the first and second pad contact holes will be formed, and forming a second spacer on sidewalls of the second contact holes and the first and second pad contact holes before forming the second contact plugs.

BRIEF DESCRIPTION OF THE DRAWINGS

For a more complete understanding of the disclosure, reference should be made to the following detailed description and accompanying drawings wherein.

Figure 1A:
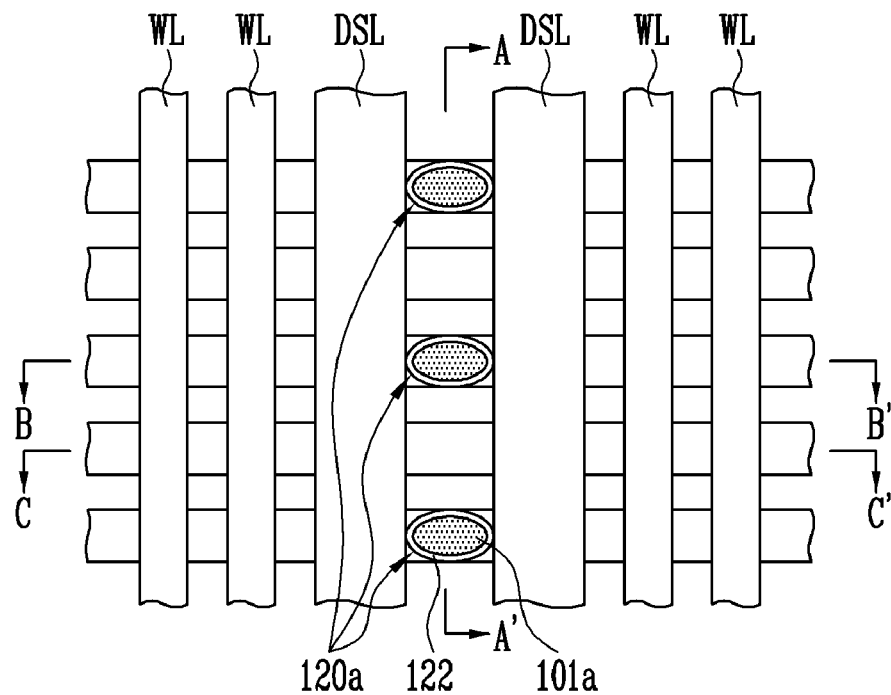
FIGS. 1A to 1F are layout diagrams illustrating a method of fabricating a flash memory device according to one embodiment of the invention.

While the disclosed device and method are susceptible to embodiments in various forms, specific embodiments are illustrated in the drawings (and will hereafter be described) with the understanding that the disclosure is intended to be illustrative, and is not intended to limit the invention to the specific embodiments described and illustrated herein.

DESCRIPTION OF SPECIFIC EMBODIMENTS

A flash memory device according to embodiments of the invention includes a plurality of cell arrays. The plurality of cell arrays includes a plurality of cell strings. Each of the cell strings includes a source select transistor, a plurality of memory cells, and a drain select transistor, which are connected in series. The source of the source select transistor is coupled to a common source line, and the drain of the drain select transistor is coupled to a bit line. Gates of the source select transistors are connected to form a source select line, gates of the drain select transistors are connected to form a drain select line DSL, and gates of the memory cells are connected to form a word line WL. The word line WL is connected between the drain select line DSL and the source select line, and the bit line intersects the word line.

Figure 2A:
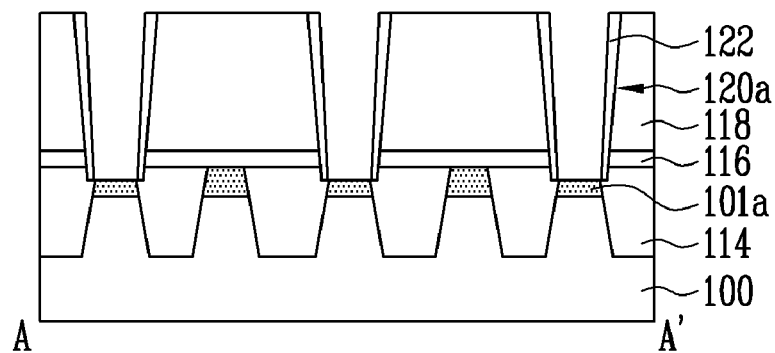
FIGS. 2A to 2F are sectional views of the flash memory device taken along line A-A' of FIGS. 1A to 1F in order to describe the fabrication method of the flash memory device.
Figure 3A:
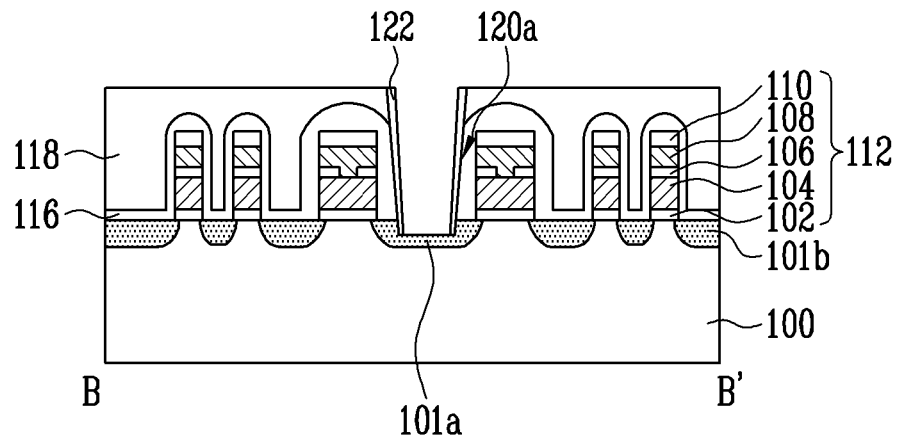
FIGS. 3A to 3F are sectional views of the flash memory device taken along line B-B' of FIGS. 1A to 1F in order to describe the fabrication method of the flash memory device.
Figure 4A:
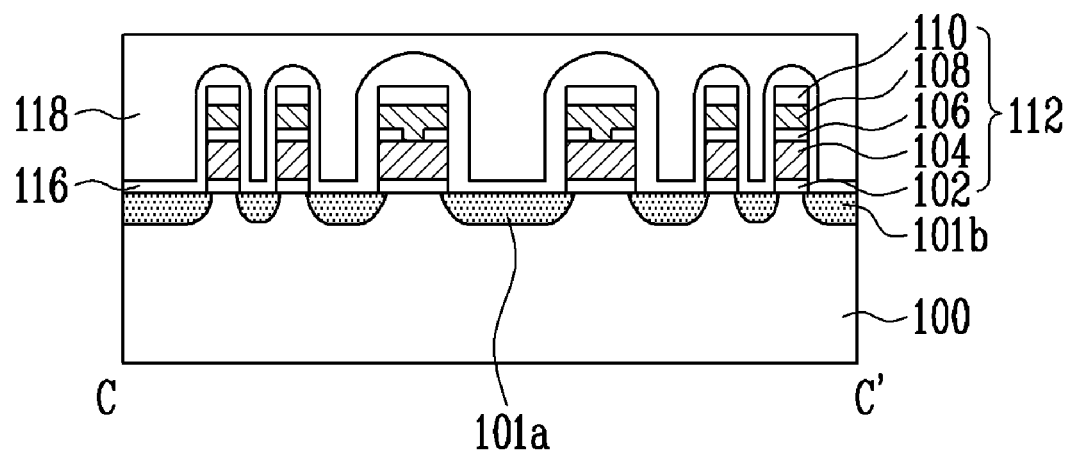
FIGS. 4A to 4F are sectional views of the flash memory device taken along line C-C' of FIGS. 1A to 1F in order to describe the fabrication method of the flash memory device.

Referring to FIGS. 1A, 2A, 3A, and 4A, there is provided a semiconductor substrate 100 in which gate patterns 112 and first and second junctions 101a, 101b are formed. Each of the gate patterns 112 has a structure in which a tunnel dielectric layer 102, a floating gate 104, a dielectric layer 106, and a control gate 108 are sequentially stacked. A hard mask layer 110 can be further formed on the control gate 108. The control gates 108 of cells formed in different strings of the gate patterns 112 are connected to become word lines, source select lines, or drain select lines. The control gates 108 of gate patterns 112 shown in the drawings are connected to form drain select lines DSL and word lines WL. The dielectric layer 106 of the gate patterns 112 that form the drain select line DSL and the source select line, includes a contact hole that exposes the floating gate 104 so that the floating gate 104 can be electrically connected to the control gate 108 through the contact hole.

The first and second junctions 101a, 101b are formed by injecting ions into the semiconductor substrate 100 using the gate patterns 112 as a mask. The first and second junctions 101a, 101b are isolated by isolation layers 114. The first junctions 101a form drain areas between the drain select lines DSL and source areas between the source select lines. The second junctions 101b form cell junctions between the word lines.

A first etch-stop layer 116, such as a self-aligned contact (SAC) nitride layer, and a first pre-metal dielectric layer 118 are formed over the semiconductor substrate 100 including the gate patterns 112. The first pre-metal dielectric layer 118 can be formed, for example, of oxide-based material.

The first pre-metal dielectric layer 118 is preferably formed to as low a height as possible, so as to increase a subsequent contact etch margin.

A drain contact mask pattern (not shown) is formed over the first pre-metal dielectric layer 118. The drain contact mask pattern exposes a portion of the first pre-metal dielectric layer 118 corresponding to a first drain area of the first junctions 101a. The exposed first pre-metal dielectric layer 118 and the underlying first etch-stop layer 116 are etched using the drain contact mask pattern as a mask to form first contact holes 120a. The first contact holes 120a expose the first drain areas of the first junctions 101a and define the areas in which first contact plugs 124a will be subsequently formed. A bowing phenomenon is not generated during formation of the first contact holes 120a because the thickness of the first pre-metal dielectric layer 118 is small. The drain contact mask pattern is then removed, for example, through a strip and cleaning process.

A first spacer 122 is formed on sidewalls of the first contact holes 120a. The first spacer 122 can be formed, for example, by gap filling a portion of the first contact holes 120a with an insulating layer (not shown) of a liner form, and then etching the insulating layer using a spacer etch process, which removes a horizontal portion of the insulating layer. A vertical portion of the insulating layer that is formed thicker than the horizontal portion remains on the sidewalls of the first contact holes 120a, forming the first spacer 122. The first spacer 122 is, preferably, formed of material having a different etch selectivity than that of the first pre-metal dielectric layer 118. The first spacer 122 can be formed, for example, of nitride-based materials, such as silicon nitride ($Si_3N_4$) or silicon oxynitride (SiON).

In general, when the first pre-metal dielectric layer 118 is formed, defects and/or voids can occur in a deposition process. The removal of the defect materials during a cleaning process can cause generation of random bridges in the middle of contact holes after subsequent contact plugs (not shown) are formed. Voids connect holes after the cleaning process, which can cause bridges to form. In the invention, however, the first spacer 122 formed on the sidewalls of the first contact holes 120a can prevent the occurrence of bridges between the contact holes. Furthermore, the first spacers can also prevent the loss of the sidewalls of the first pre-metal dielectric layer 118 due to over-etch of the first pre-metal dielectric layer 118 during a cleaning process performed before the conductive layer for contact plugs is deposited. This can prevent formation of bridges between the drain select lines DSL.

Figure 1B:
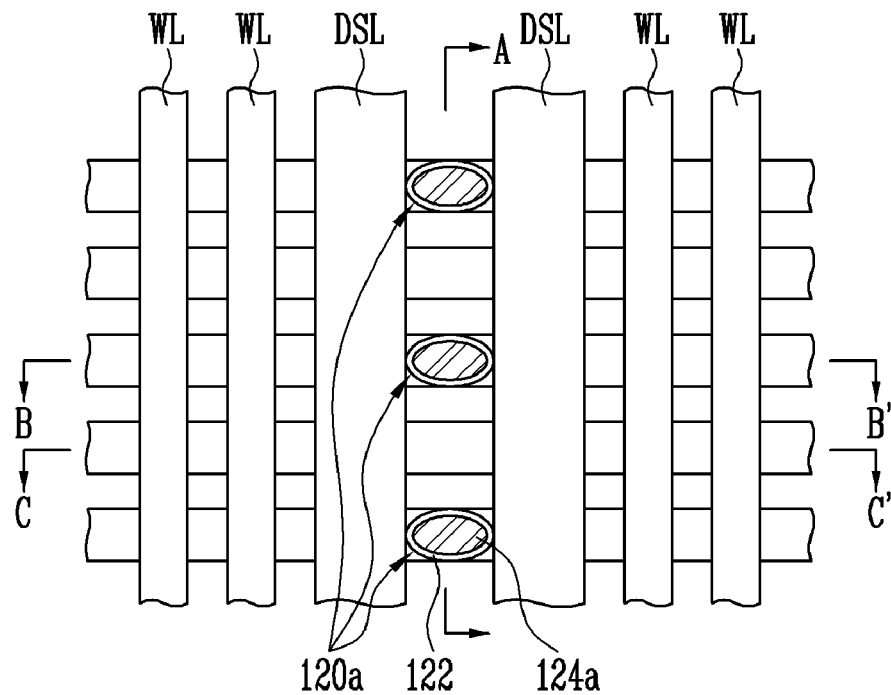
Figure 2B:
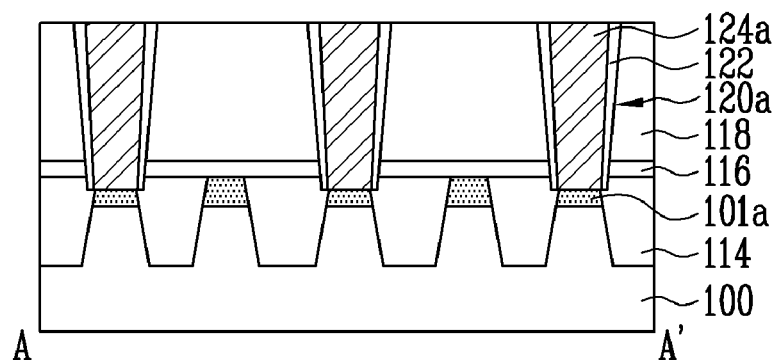
Figure 3B:
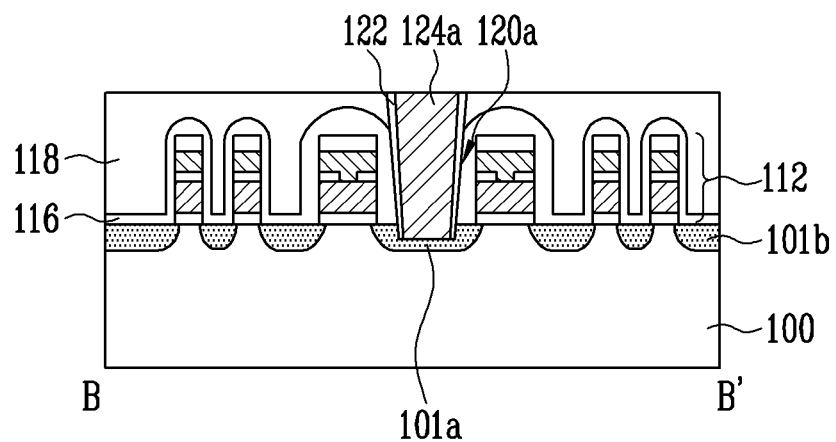
Figure 4B:
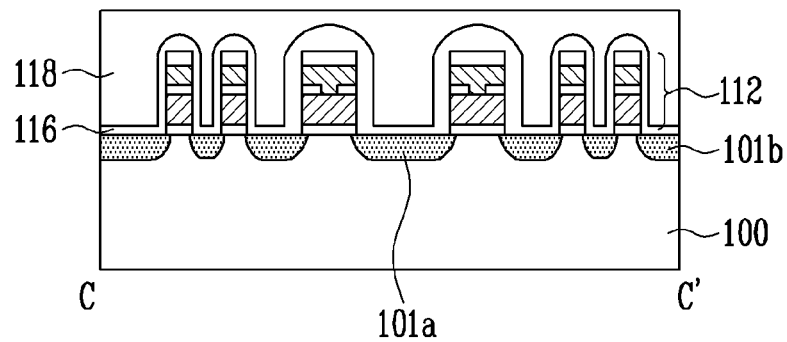

Referring to FIGS. 1B, 2B, 3B and 4B, first contact plugs 124a are formed within the first contact holes 120a. The first contact plugs 124a are formed on the first junctions 101a between the gate patterns 112 (for example, the drain select lines DSL). A conductive layer (not shown) is formed over the first spacer 122 and the first pre-metal dielectric layer 118, including the first contact holes 120a, so that the first contact holes 120a are gap-filled. The conductive layer can be formed, for example, of polysilicon or tungsten. The first contact plugs 124a can be formed within the first contact holes 120a by performing, for example, a chemical mechanical polishing (CMP) process that exposes the first pre-metal dielectric layer 118.

Figure 1C:
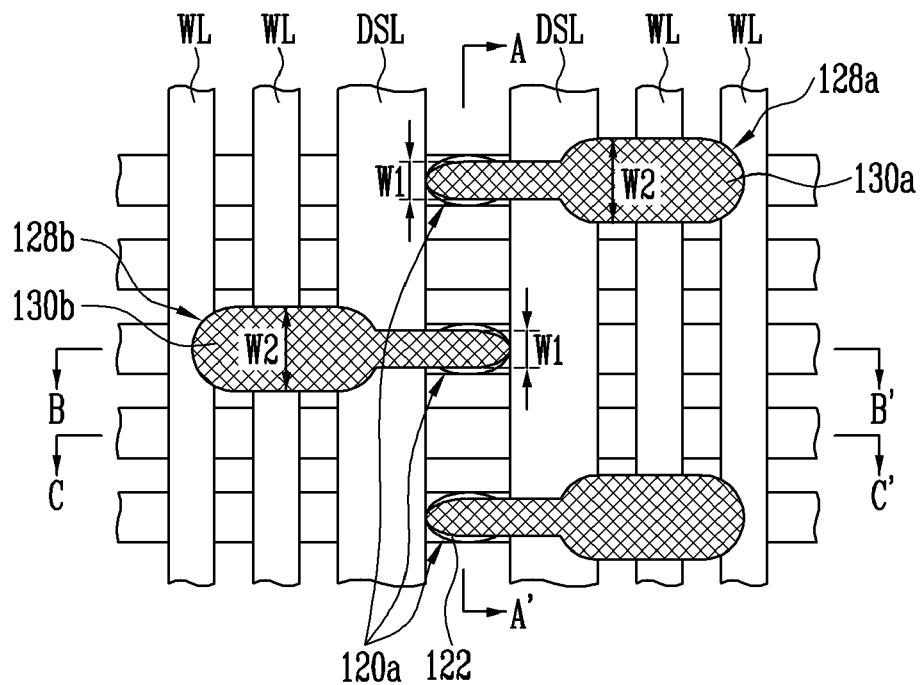
Figure 2C:
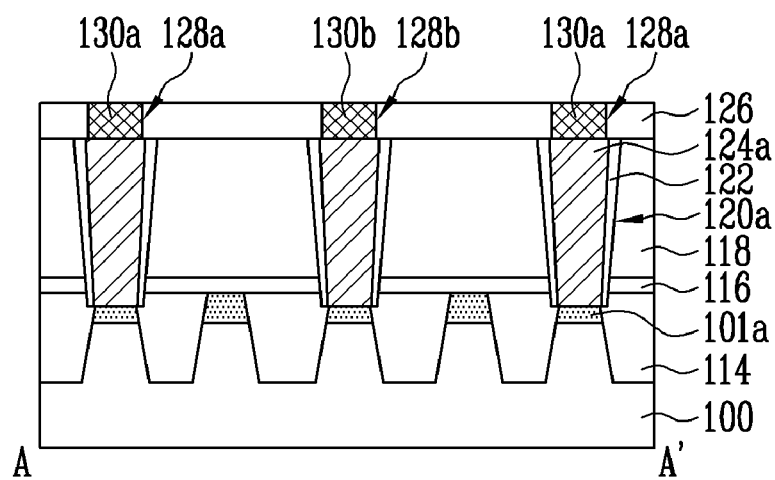
Figure 3C:
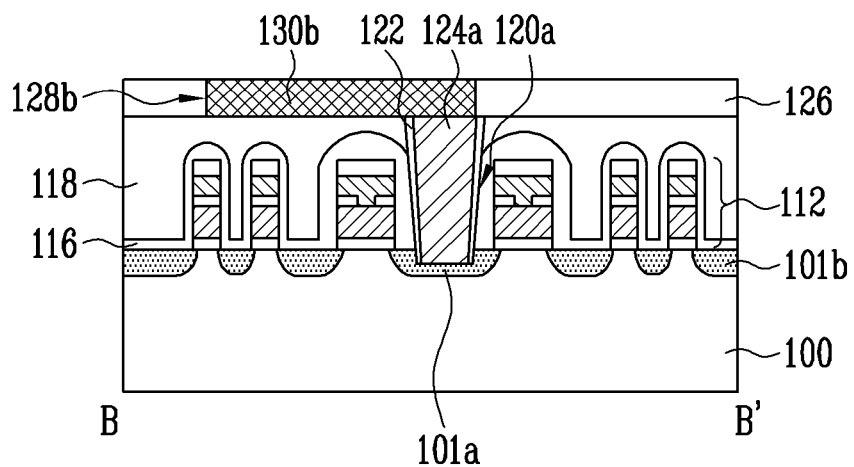
Figure 4C:
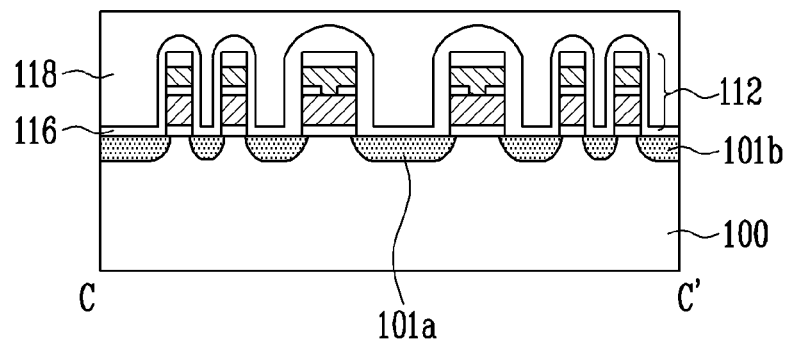

Referring to FIGS. 1C, 2C, 3C and 4C, a second pre-metal dielectric layer 126 is formed over the first contact plugs 124a and the first pre-metal dielectric layer 118. The second pre-metal dielectric layer 126 can be formed, for example, of oxide-based material. The second pre-metal dielectric layer 126 is preferably formed to as low a height as possible in order to increase a subsequent contact etch margin. A pad mask pattern (not shown) is then formed on the second pre-metal dielectric layer 126. The pad mask pattern exposes a portion of the second pre-metal dielectric layer 126 and defines areas in which the first and second conductive pads 130a, 130b will be formed.

The exposed second pre-metal dielectric layer 126 is removed using an etch process employing the pad mask pattern as a mask to form first and second pad holes 128a, 128b. The first and second pad holes 128a, 128b expose the first contact plugs 124a and are alternately disposed. The first and second pad holes 128a, 128b can be formed to extend from the first contact plug 124a over the word lines WL toward the drain select line DSL. The first and second pad holes 128a, 128b define areas in which first and second conductive pads 130a, 130b will be subsequently formed. The first and second pad holes 128a, 128b extend in opposite directions so as not to connect to each other. The pad mask pattern is then removed, for example, through a strip and cleaning process.

A second etch-stop layer (not shown) having an etch selectivity different than that of the second pre-metal dielectric layer 126 can be formed between the first pre-metal dielectric layer 118 and the second pre-metal dielectric layer 126 to prevent damage to the gate pattern 112 caused by removal of the first pre-metal dielectric layer 118 during etching of the second pre-metal dielectric layer 126. When the second etch-stop layer is formed, the first and second pad holes 128a, 128b are formed to penetrate the second etch-stop layer.

A conductive layer (not shown) is formed on the second pre-metal dielectric layer 126, including the first and second pad holes 128a, 128b, such that the first and second pad holes 128a, 128b are gap-filled. The conductive layer can be formed, for example, from tungsten. A CMP process is then performed to expose the second pre-metal dielectric layer 126, thereby forming the first and second conductive pads 130a, 130b within the first and second pad holes 128a, 128b, respectively.

The first conductive pad 130a is coupled to the first contact plug 124a and intersects the drain select line DSL of one direction, and the second conductive pad 130b is coupled to another first contact plug 124a and intersects the drain select line DSL of the opposite direction. The first and second conductive pads 130a, 130b are disposed alternately and extend in opposite directions. The first and second conductive pads 130a, 130b extend from the first contact plug 124a over the word line WL toward the drain select line DSL.

A width W2 of a portion of the first and second conductive pads 130a, 130b to be connected to subsequently formed first and second pad contact plugs 138a, 138b, is preferably greater than a width W1 of a portion of the first and second conductive pads 130a, 130b connected to the first contact plug 124a. This can ensure stability of the process.

Figure 1D:
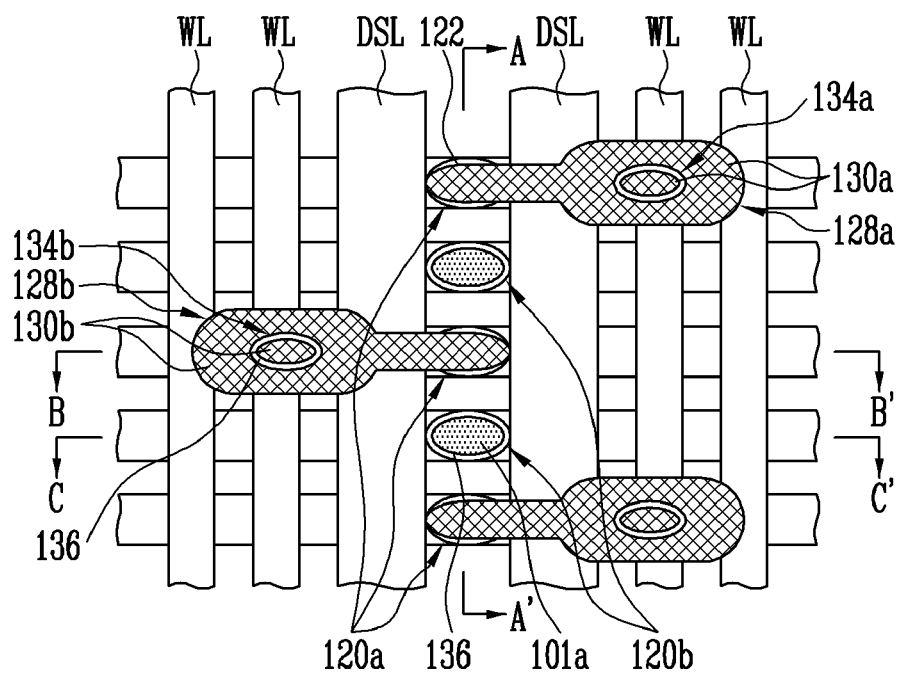
Figure 2D:
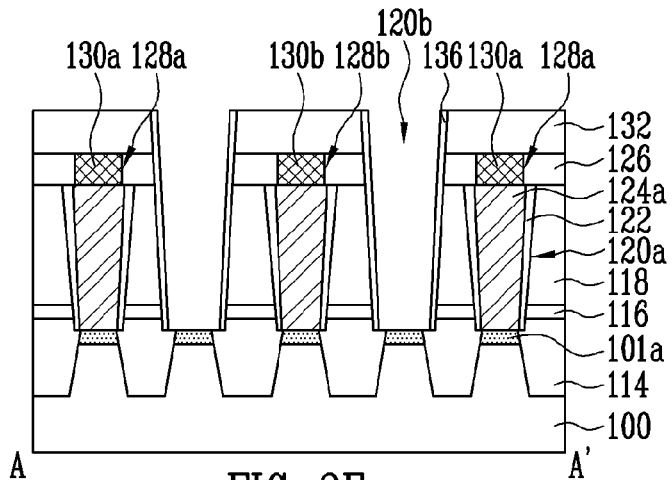
Figure 3D:
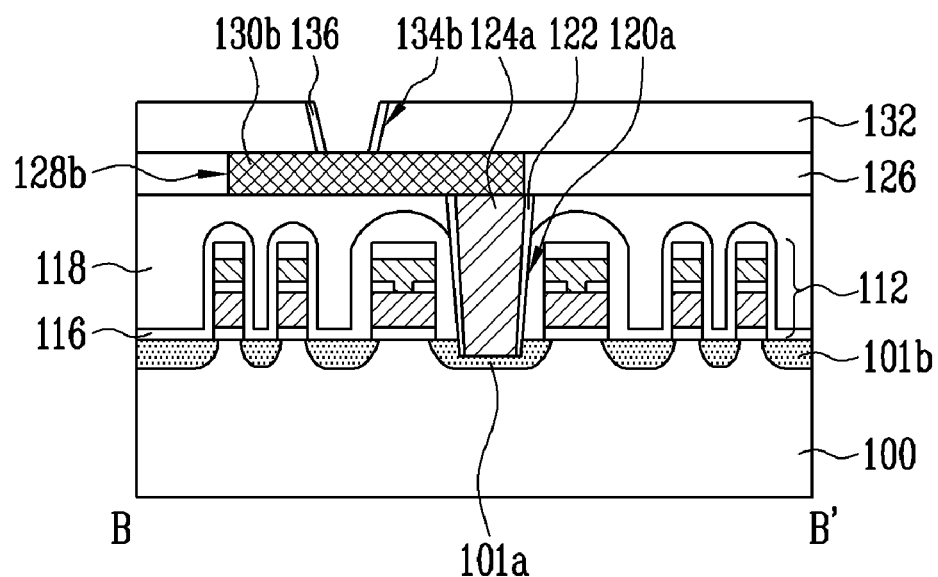
Figure 4D:
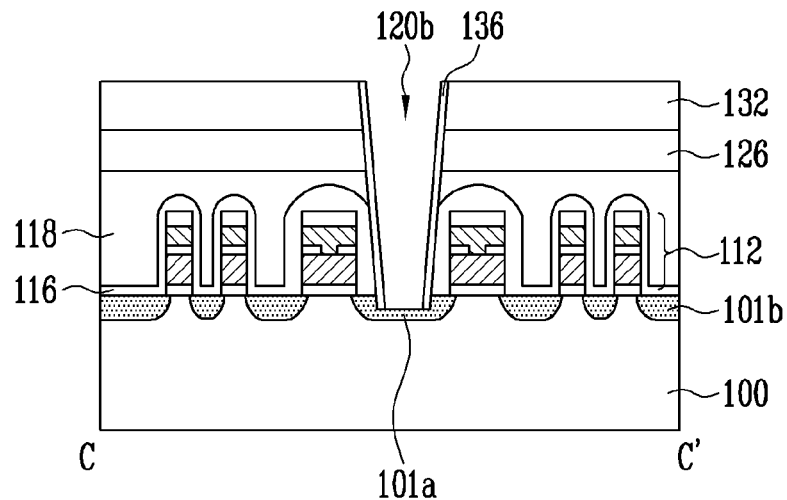

Referring to FIGS. 1D, 2D, 3D and 4D, second contact holes 120b that expose second drain areas of the first junctions 101a disposed between the first contact holes 120a are formed by first forming a third pre-metal dielectric layer 132 on the second pre-metal dielectric layer 126 including the first and second conductive pads 130a, 130b. The third pre-metal dielectric layer 132 can be formed, for example, of oxide-based material. The third pre-metal dielectric layer 132 is preferably formed to as low a height as possible in order to increase a subsequent contact etch margin. A drain pad contact mask pattern (not shown) is formed over the third pre-metal dielectric layer 132. The drain pad contact mask pattern exposes a portion of the third pre-metal dielectric layer 132, and defines areas in which the second contact holes 120b and first and second pad contact holes 134a, 134b will be formed.

The exposed third pre-metal dielectric layer 132 and the underlying second and first pre-metal dielectric layer 126, 118 are etched using the drain pad contact mask pattern as a mask to form the second contact holes 120b that expose the second drain areas of the first junctions 101a. The second contact holes 120b are formed to sufficiently secure a bottom CD to prevent a not-open failure. The second contact holes 120b define areas in which second contact plugs 124b will be subsequently formed. The exposed third pre-metal dielectric layer 132 is etched to form the first and second pad contact holes 134a, 134b, which expose the ends of the first and second conductive pads 130a, 130b. The first and second pad contact holes 134a, 134b define areas in which first and second pad contact plugs 138a, 138b will be subsequently formed.

Although not shown in the drawings, a bowing phenomenon, in which the width of the contact hole at an intermediate depth is increased, can occur when the second contact holes 120b are formed as a result of the thickness of the first, second, and third pre-metal dielectric layers 118, 126, and 132. As compared with the prior art, however, the bowing effect can be mitigated by forming the first, second, and third pre-metal dielectric layers 118, 126, and 132 to a height that is as low as possible, and the aspect ratio can be reduced.

The first and second pad contact holes 134a, 134b are preferably formed at the farthest point away from the second contact holes 120b to prevent the formation of a bridge due to bowing between the second contact plugs 124b and the subsequently formed pad contact plugs 138a, 138b. That is, the first and second pad contact holes 134a, 134b are formed at the ends of the first and second conductive pads 130a, 130b, which are farthest from the first contact plug 124a. Advantageously, the alignment margin, between the first and second pad contact holes 134a, 134b and the first contact hole 120a, can be secured when forming the first and second pad contact holes 134a, 134b. The drain pad contact mask pattern is then removed, for example, through a strip and cleaning process.

A second spacer 136 is formed on the sidewalls of the second contact holes 120b and the first and second pad contact holes 134a, 134b. The second spacer 136 is formed by partially gap-filling the second contact holes 102b and the first and second pad contact holes 134a, 134b with an insulating layer (not shown) of a liner form, and etching the insulating layer using a spacer etch process to remove a horizontal portion of the insulating layer. A vertical portion of the insulating layer, which is thicker than the horizontal portion of the insulating layer, remains on the sidewalls of the second contact holes 120b and the first and second pad contact holes 134a, 134b, thus forming the second spacer 136. The second spacer 136 is formed of material having a different etch selectivity than that of the first, second, or third pre-metal dielectric layer 118, 126, and 132. The second spacer 136 can be formed, for example, of nitride-based materials, such as silicon nitride ($Si_3N_4$) or silicon oxynitride (SiON).

The second spacer 136, much like the first spacer 22, can prevent the formation of a bridge between contact holes due to void and defects that are generated during formation of the first, second, and third pre-metal dielectric layers 118, 126 and 132. The second spacer 136 can also serve as an etch barrier in a subsequent wet cleaning process.

Figure 1E:
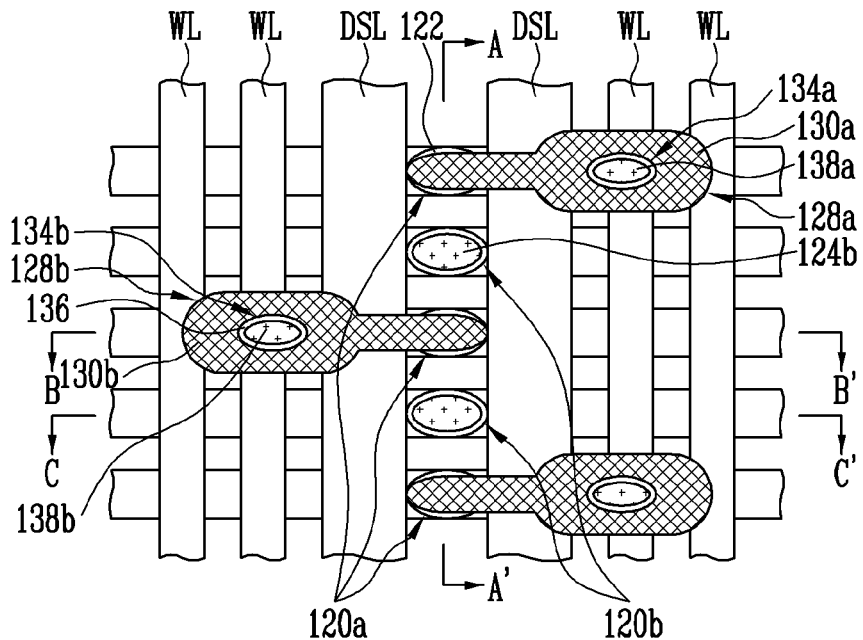
Figure 2E:
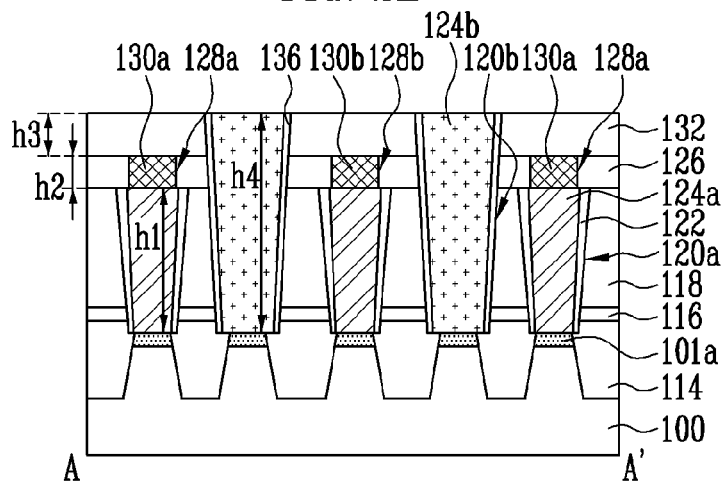
Figure 3E:
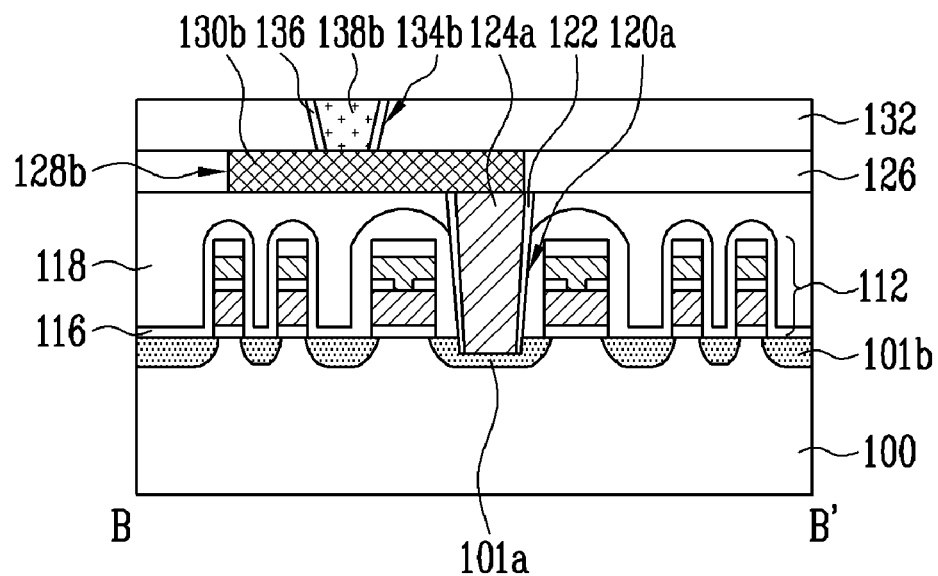
Figure 4E:
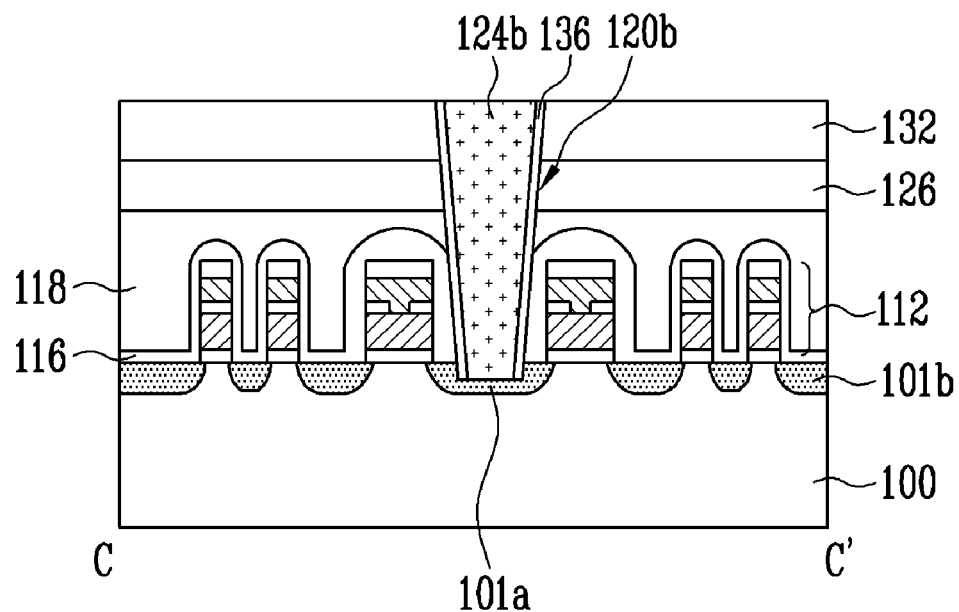

Referring to FIGS. 1E, 2E, 3E, and 4E, second contact plugs 124b are formed in the second contact holes 120b on the second drain areas of the first junctions 101a between the gate patterns 112. First and second pad contact plugs 138a, 138b are formed within the first and second pad contact holes 134a, 134b, respectively.

The second contact plugs 124b and the first and second pad contact plugs 138a, 138b are formed by forming a conductive layer (not shown) on the third pre-metal dielectric layer 132, including the second contact holes 120b and the first and second pad contact holes 134a, 134b, such that the second contact holes 120b and the first and second pad contact holes 134a, 134b are gap-filled. The conductive layer can be formed, for example, of polysilicon or tungsten.

A CMP process, for example, can be performed to expose the third pre-metal dielectric layer 132, thus forming the second contact plugs 124b within the second contact holes 120b. The second contact plugs 124b have a height different than that of the first contact plugs 124a and are alternately disposed. A height h4 of the second contact plug 124b is preferably substantially equal to the sum of a height h1 of the first contact plug 124a, a height h2 of the first and second conductive pads 130a, 130b, and height h3 of the third pre-metal dielectric layer 132. Consequently, the height h4 of the second contact plug 124b is preferably greater than the height h1 of the first contact plug 124a. The CMP process also forms the first and second pad contact plugs 138a, 138b within the first and second pad contact holes 134a, 134b. The first and second pad contact plugs 138a, 138b are alternately connected to the first contact plugs 124a and formed in opposite directions.

The second contact hole 120b preferably has a reduced aspect ratio. Thus, when the second contact plug 124b is formed, a gap-fill characteristic of the contact hole can be improved and the second contact plug 124b can be formed without voids. The heights of the first contact plugs 124a and the second contact plugs 124b differ. Accordingly, although the second contact plugs 124b are formed within the second contact holes 120b having bowing, a bridge between the second contact plugs 124b and the adjacent first contact plugs 124a can be prevented by the first contact plugs 124a having a relatively low height and not having bowing.

Furthermore, a contact structure for connecting bit lines to be subsequently formed and the first junctions 101a is divided into the first and second contact plugs 124a, 124b and the first and second pad contact plugs 138a, 138b, but a distance between the second contact plug 124b and the first and second pad contact plugs 138a, 138b is far. Thus, a bridge between the neighboring first and second contact plugs 124a, 124b can be prevented.

Figure 1F:
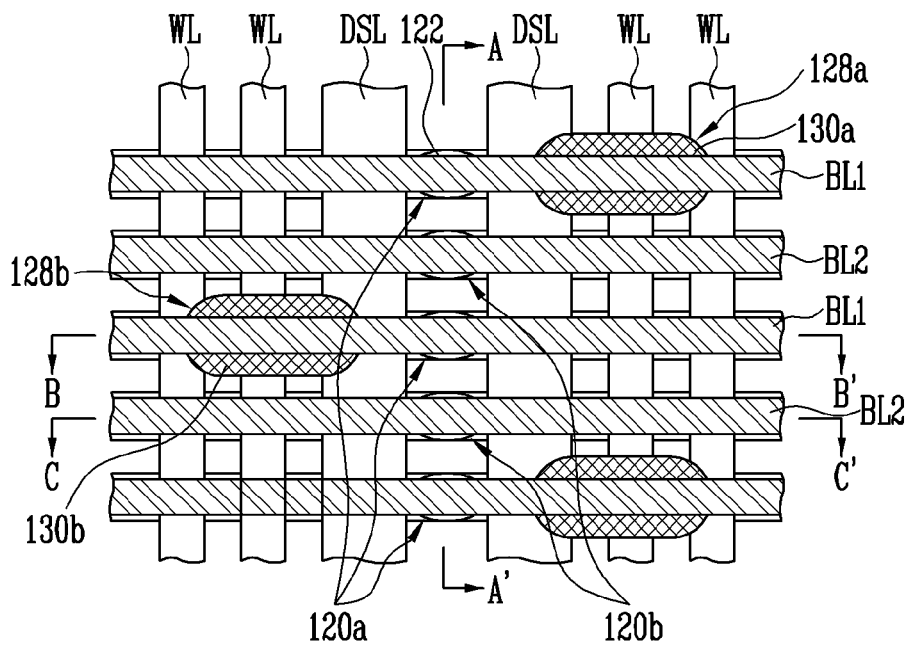
Figure 2F:
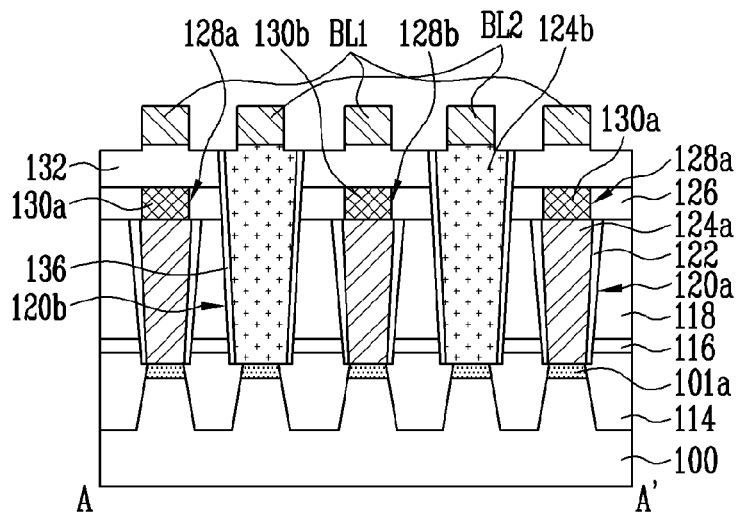
Figure 3F:
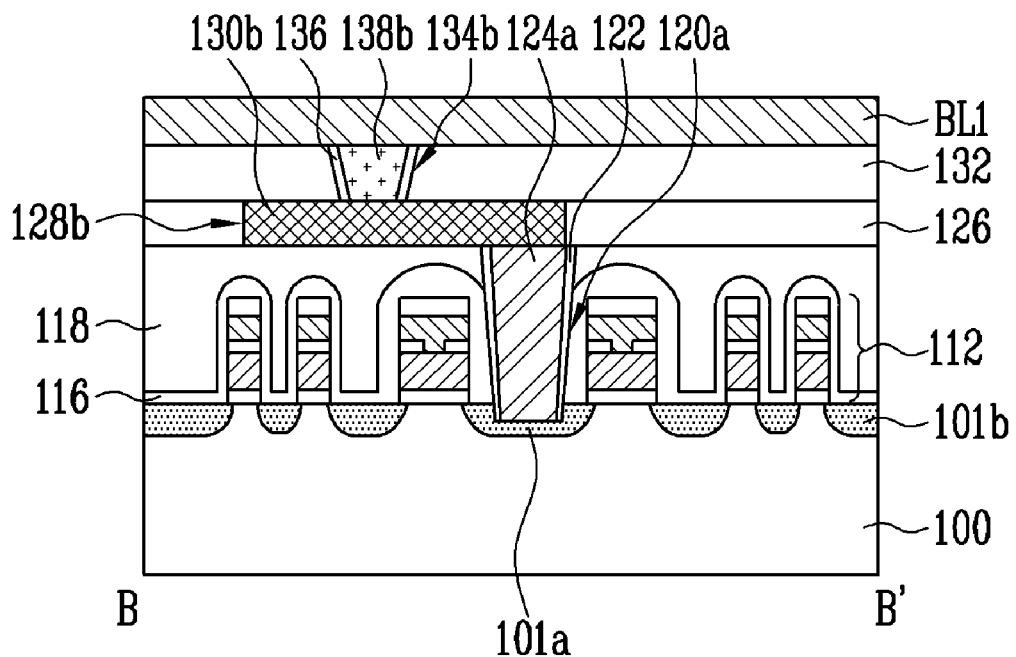
Figure 4F:
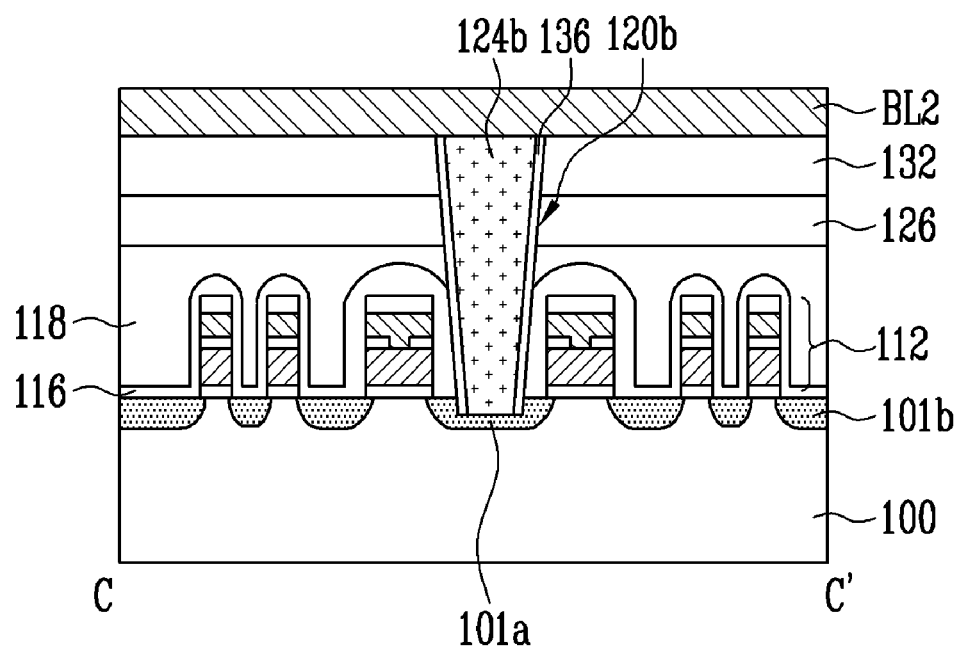

Referring to FIGS. 1F, 2F, 3F and 4F, a plurality of first and second bit lines BL1, BL2 are formed. First, a metal layer (not shown) is formed on the second contact plugs 124b and the first and second pad contact plugs 138a, 138b. The metal layer is preferably formed of material having a low resistivity, for example, tungsten. A bit line mask pattern (not shown) exposing a portion of the metal layer and covering areas in which the bit lines will be formed is formed over the metal layer. The exposed metal layer is etched using the bit line mask pattern as a mask to form first and second bit lines BL1, BL2. The remaining bit line mask pattern is removed, for example, through a strip and cleaning process.

The first bit lines BL1 are connected to the first and second pad contact plugs 138a, 138b, and intersect the drain select lines DSL. The second bit lines BL2 are connected to the second contact plugs 124b and intersect the drain select lines DSL. Consequently, the first and second bit lines BL1, BL2 are alternately arranged.

The first and second pad contact plugs 138a, 138b electrically connect the first and second conductive pads 130a, 130b and the first bit lines BL1. Accordingly, the first bit lines BL1 and the first drain areas of the first junctions 101a are electrically connected to each other. The second bit lines BL2 are electrically connected to the second drain areas of the first junctions 101a through the second contact plugs 124b.

In the invention, although the first and second bit lines BL1, BL2 are overlapped with the first and second contact holes 120a, 120b, respectively, the second bit lines BL2 and the neighboring first contact plugs 124a exist far from each other. Accordingly, it is advantageous in terms of the prevention of the occurrence of a bridge between the second bit lines BL2 and the first contact plugs 124a.

Figure 5A:
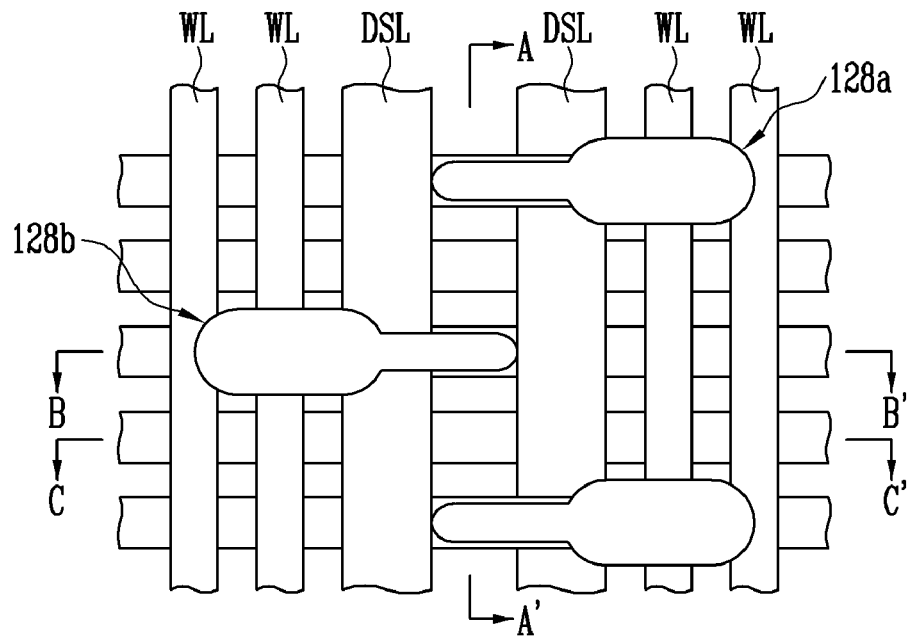
FIGS. 5A to 5F are layout diagrams illustrating a method of fabricating a flash memory device according to another embodiment of the invention.
Figure 6A:
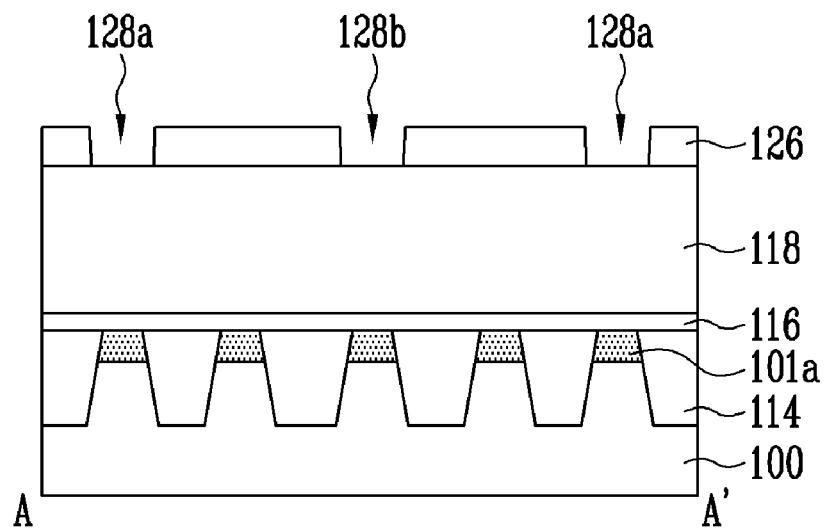
FIGS. 6A to 6F are sectional views of the flash memory device taken along line A-A' of FIGS. 5A to 5F in order to describe the fabrication method of the flash memory device.
Figure 7A:
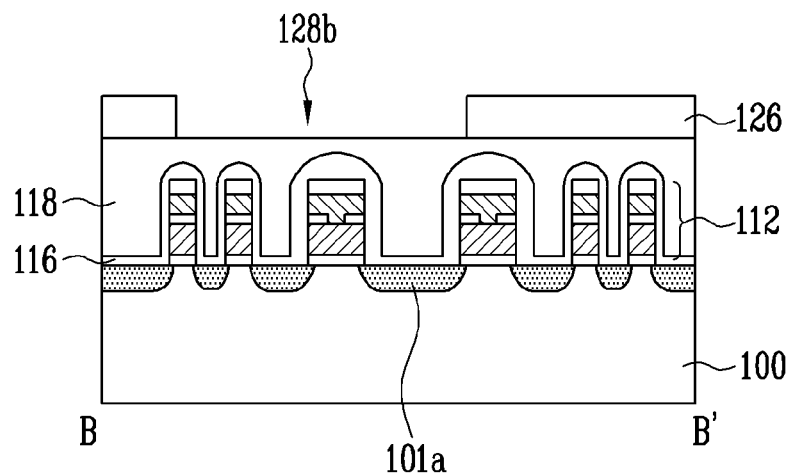
FIGS. 7A to 7F are sectional views of the flash memory device taken along line B-B' of FIGS. 5A to 5F in order to describe the fabrication method of the flash memory device.
Figure 8A:
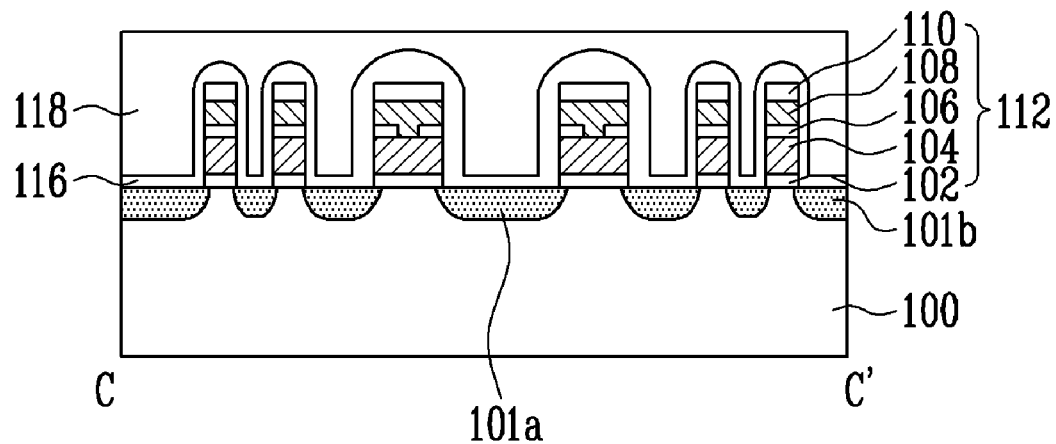
FIGS. 8A to 8F are sectional views of the flash memory device taken along line C-C' of FIGS. 5A to 5F in order to describe the fabrication method of the flash memory device.

Referring to FIGS. 5A, 6A, 7A and 8A, a method of fabricating a flash memory device in accordance with a second embodiment of the invention includes sequentially forming a first etch-stop layer 116, a first pre-metal dielectric layer 118, and a second pre-metal dielectric layer 126 including first and second pad holes 128a, 128b over a semiconductor substrate 100 having gate patterns 112 and first and second junctions 101a, 101b. A second etch stop layer (not shown) can be further formed between the first pre-metal dielectric layer 118 and the second pre-metal dielectric layer 126. The gate patterns 112, the first and second junctions 101a, 101b, the first etch-stop layer 116, and the first pre-metal dielectric layer 118 are the same as those of FIGS. 1A, 2A, 3A, and 4A, and description thereof is omitted for simplicity. The second pre-metal dielectric layer 126 is the same as that of FIGS. 1C, 2C, 3C, and 4C, and description thereof is omitted for simplicity.

Formation of the first and second pad holes 128a, 128b is the same as that of FIGS. 1C, 2C, 3C, and 4C. The first and second pad holes 128a, 128b are alternately formed in opposite directions and are overlapped with the first junctions 101a.

Figure 5B:
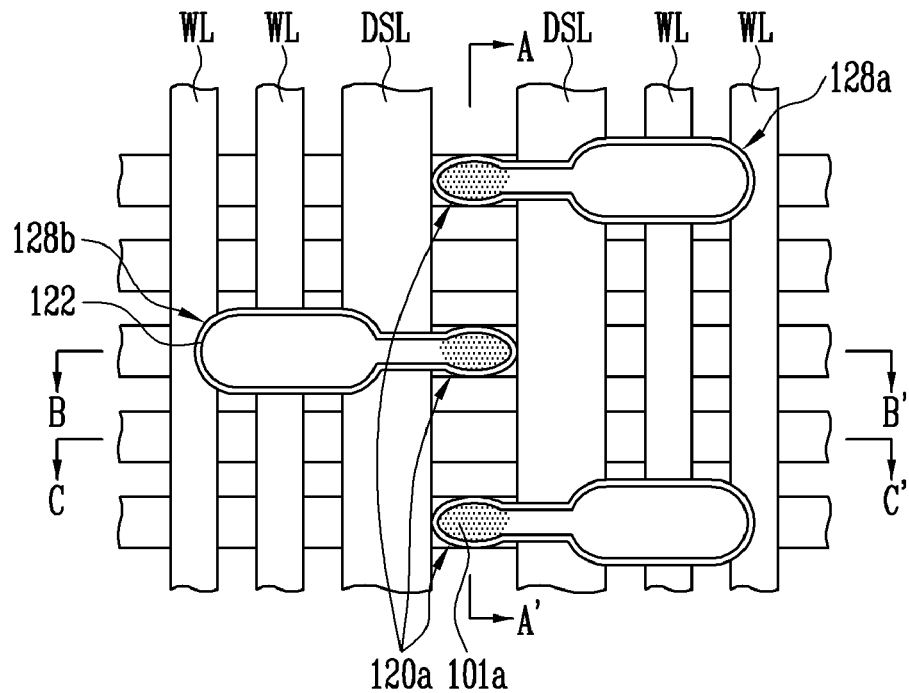
Figure 6B:
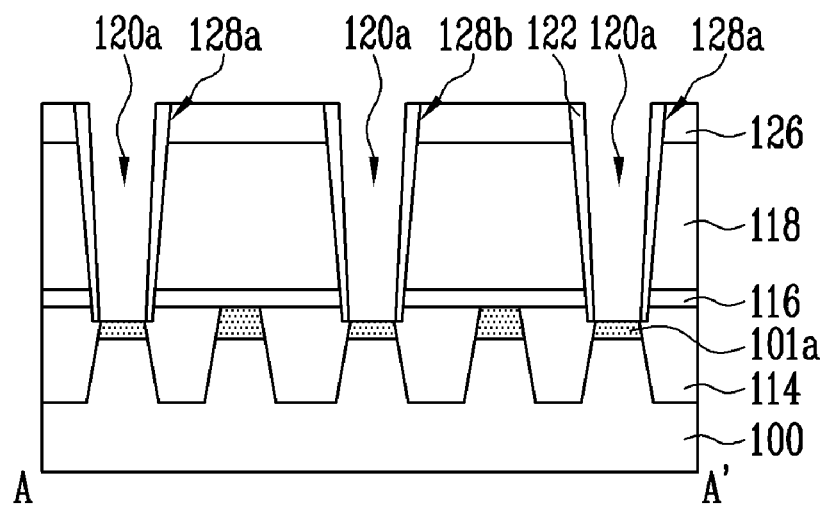
Figure 7B:
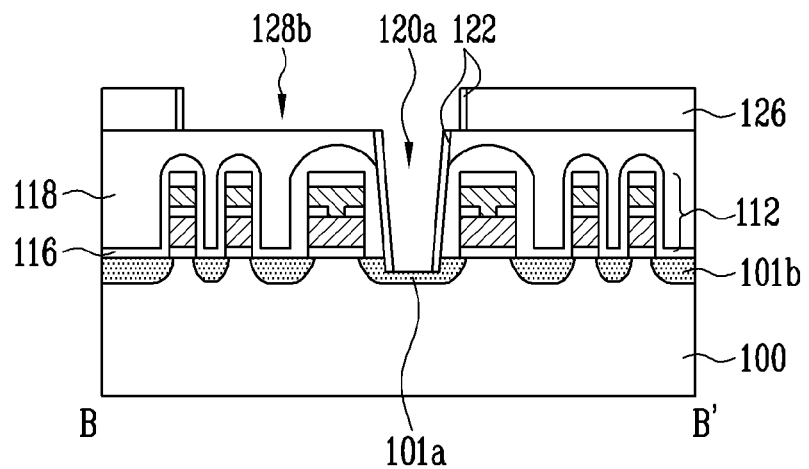
Figure 8B:
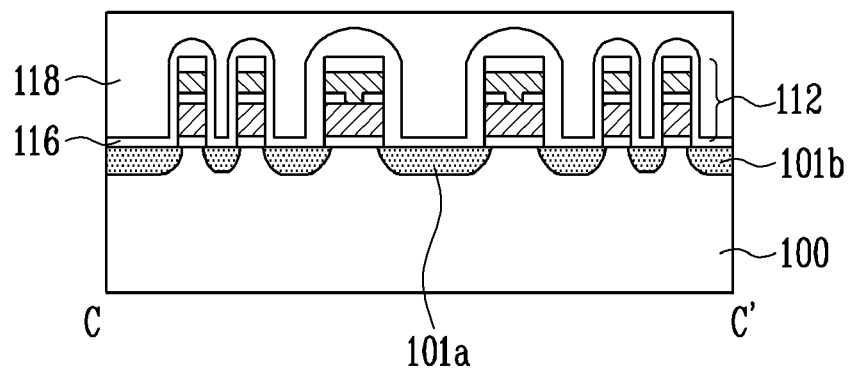

Unlike the fabrication method shown in FIGS. 1A, 2A, 3A, and 4A, in the fabrication method shown in FIGS. 5A, 6A, 7A, and 8A, contact holes are not formed in a first pre-metal dielectric layer 118 until the step shown in FIGS. 5B, 6B, 7B, and 8B.

Referring to FIGS. 5B, 6B, 7B, and 8B, first contact holes 120a are formed in the first pre-metal dielectric layer 118 to expose first drain areas of the first junctions 101a.

Areas of the first pre-metal dielectric layer 118 overlapped with the first junctions 101a, and exposed through the first and second pad holes 128a, 128b, are exposed between photoresist patterns formed through a photolithography process. Next, the exposed first pre-metal dielectric layer 118 is removed through an etch process to form the first contact holes 120a through which the first junctions 101a are exposed. The photoresist patterns are then removed. When the second etch-stop layer is formed, the first contact holes 120a are formed to penetrate the second etch-stop layer.

A first spacer 122 is formed on sidewalls of the first contact holes 120a and the first and second pad holes 128a, 128b by partially gap-filling the first contact holes 120a and the first and second pad holes 128a, 128b with an insulating layer (not shown) of a liner form. The insulating layer is etched using a spacer etch process to remove a horizontal portion of the insulating layer. A vertical portion of the insulating layer formed thicker than the horizontal portion remains on the sidewalls of the first contact holes 120a and the first and second pad holes 128a, 128b, thereby forming the first spacer 122. The first spacer 122 is, preferably, formed from material having a different etch selectivity than that of the first and second pre-metal dielectric layers 118, 126. The first spacer 122 is preferably formed of nitride-based materials, such as, for example, silicon nitride ($Si_3N_4$) or silicon oxynitride (SiON).

The first spacer 122 can prevent the formation of a bridge between the contact holes due to voids and defects, which are generated during formation of the first and second pre-metal dielectric layers 118, 126. The first spacer 122 can also serve as an etch barrier in a subsequent wet cleaning process.

Figure 5C:
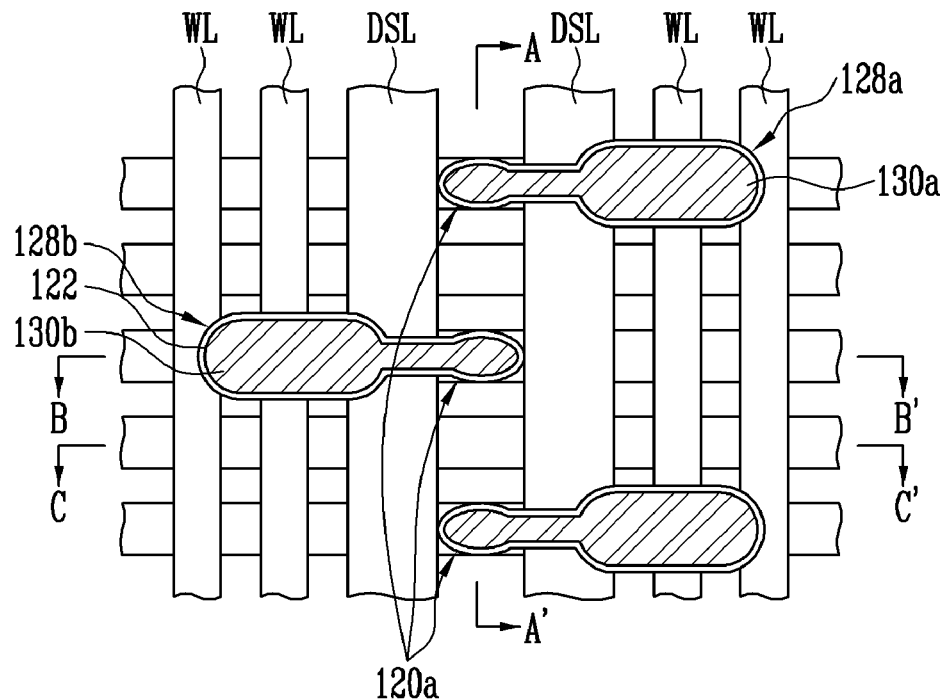
Figure 6C:
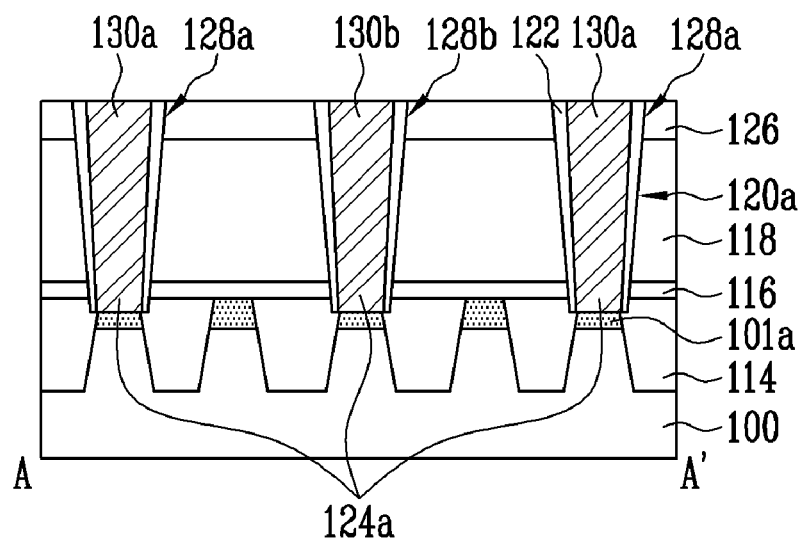
Figure 7C:
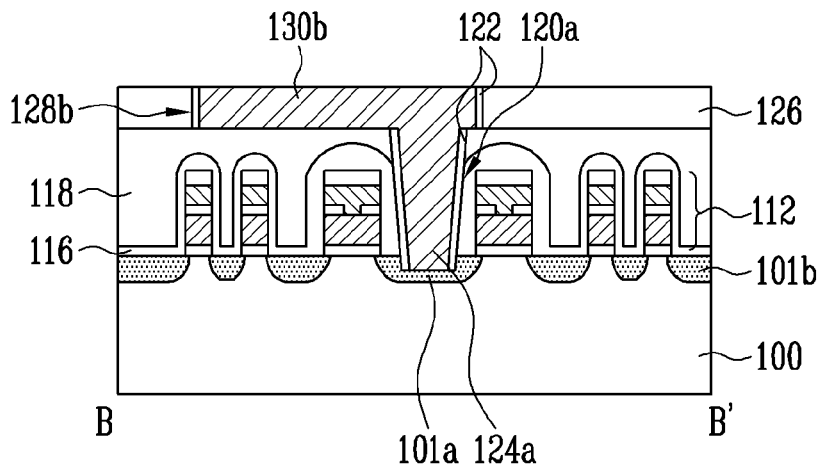
Figure 8C:
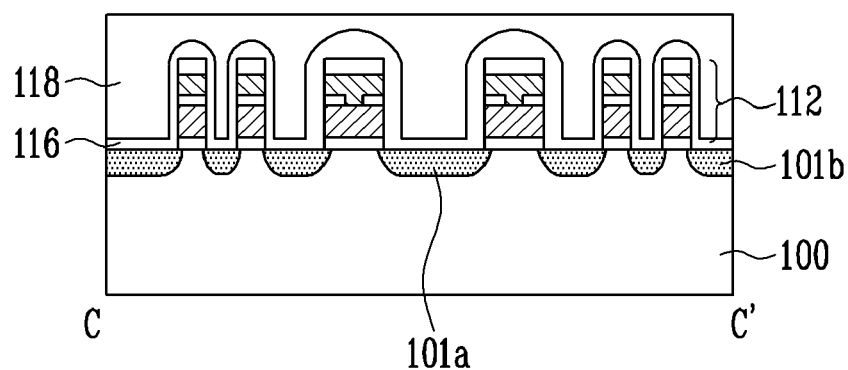

Referring to FIGS. 5C, 6C, 7C, and 8C, first contact plugs 124a are formed within the first contact holes 120a. First and second conductive pads 130a, 130b, which are connected to the first contact plugs 124a and extend in opposite directions, are formed within the first and second pad holes 128a, 128b, respectively. The structure of the first contact plugs 124a is identical to that shown in FIGS. 1B, 2B, 3B, and 4B, and the structure of the first and second conductive pads 130a, 130b is identical to that shown in FIGS. 1C, 2C, 3C, and 4C.

The first contact plugs 124a and the first and second conductive pads 130a, 130b are preferably formed integrally, and at substantially the same time. More particularly, a conductive layer is formed on the second pre-metal dielectric layer 126, including the first contact holes 120a and the first and second pad holes 128a, 128b, so that the first contact holes 120a and the first and second pad holes 128a, 128b are gap-filled. The conductive layer can be formed, for example, from polysilicon, tungsten, or the like. A CMP process is performed to expose the second pre-metal dielectric layer 126, thus forming the first contact plugs 124a within the first contact holes 120a. At substantially the same time, the first conductive pads 130a, which are connected to the first contact plugs 124a and extend in one direction, and the second conductive pads 130b, which are connected to the first contact plugs 124a and extend in the opposite direction, are formed within the first and second pad holes 128a, 128b, respectively. The first and second conductive pads 130a, 130b are electrically connected to the first contact plugs 124a.

Figure 5D:
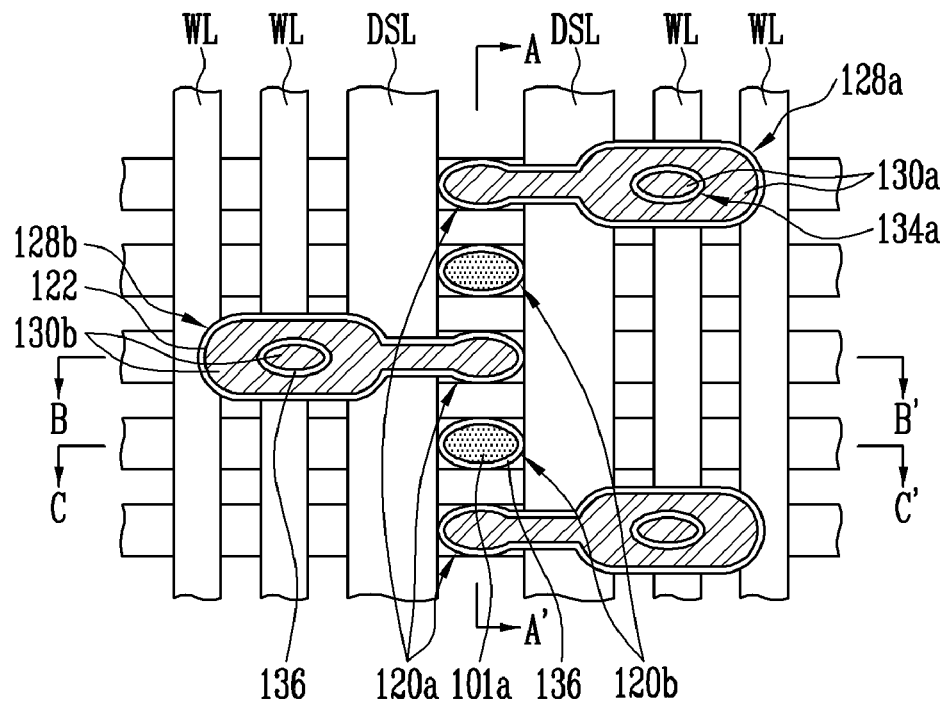
Figure 6D:
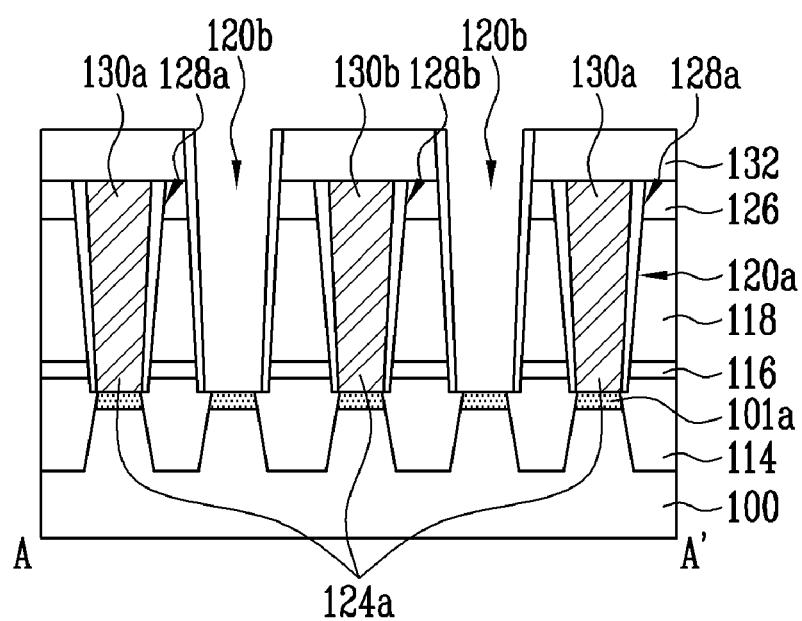
Figure 7D:
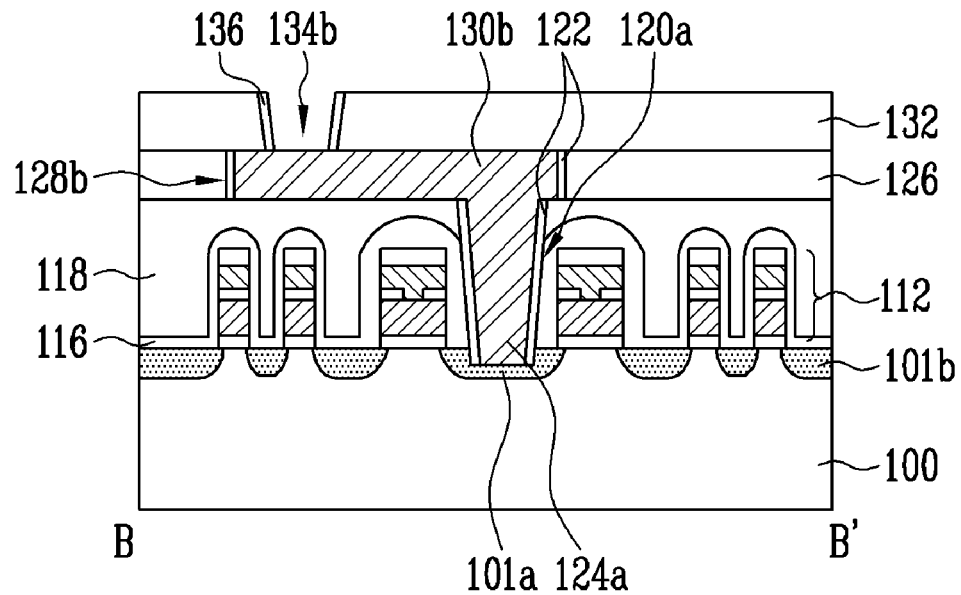
Figure 8D:
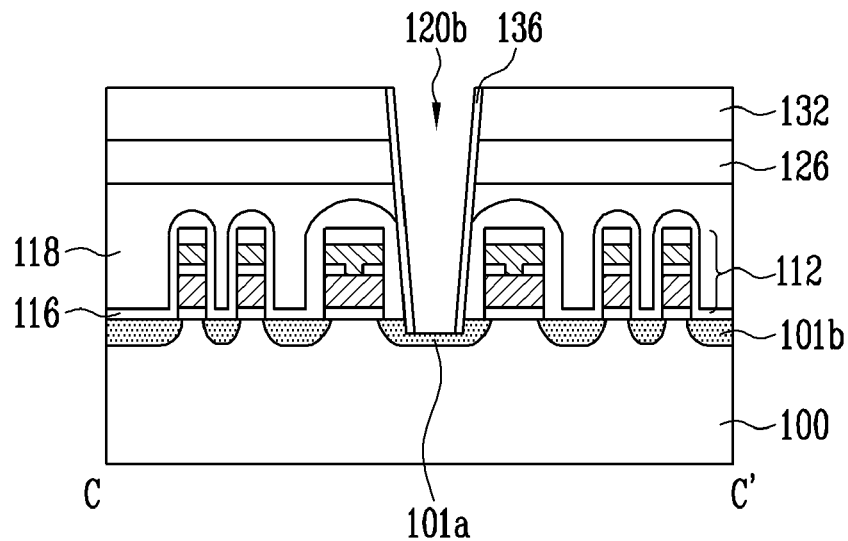

Referring to FIGS. 5D, 6D, 7D, and 8D, second contact holes 120b are formed within the first, second, and third pre-metal dielectric layers 118, 126, and 132. The second contact holes 120b are disposed alternately with the first contact holes 120a and expose the first junctions 101a between the gate patterns 112 (for example, the drain select lines DSL). First and second pad contact holes 134a, 134b are formed within the third pre-metal dielectric layer 132. Preferably, the second contact holes 120b and the first and second pad contact holes 134a, 134b are formed simultaneously. The first and second pad contact holes 134a, 134b expose ends (i.e., extended portions) of the first and second conductive pads 130a, 130b. The second contact holes 120b and the first and second pad contact holes 134a, 134b are identical to those of FIGS. 1D, 2D, 3D, and 4D, and description thereof is omitted for simplicity.

A second spacer 136 is formed on sidewalls of the second contact holes 120b and the first and second pad contact holes 134a, 134b. The second spacer 136 is identical to that of FIGS. 1D, 2D, 3D and 4D, and description thereof is omitted for simplicity.

Figure 5E:
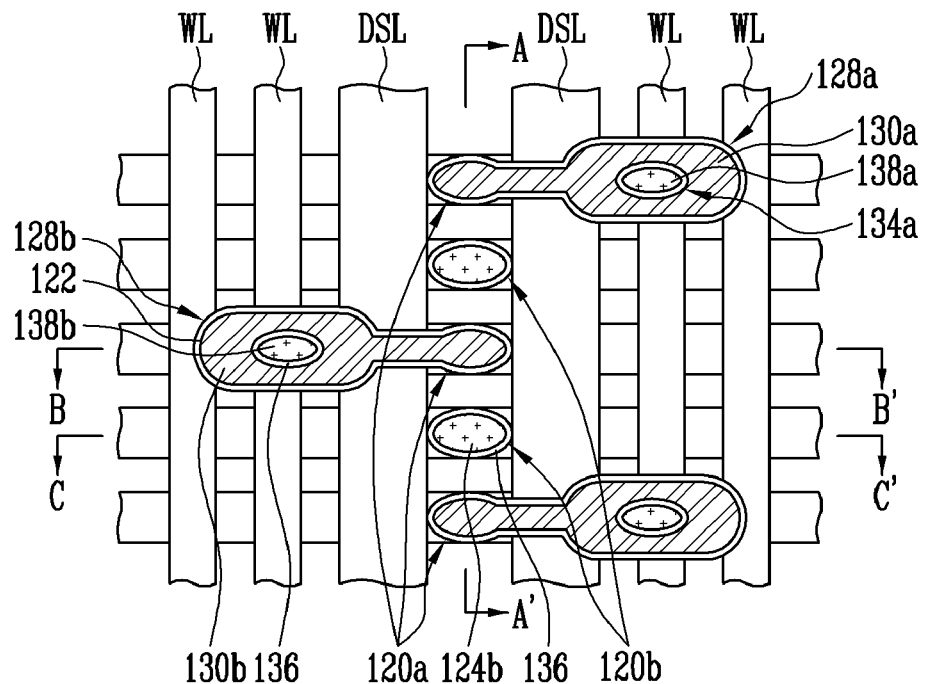
Figure 6E:
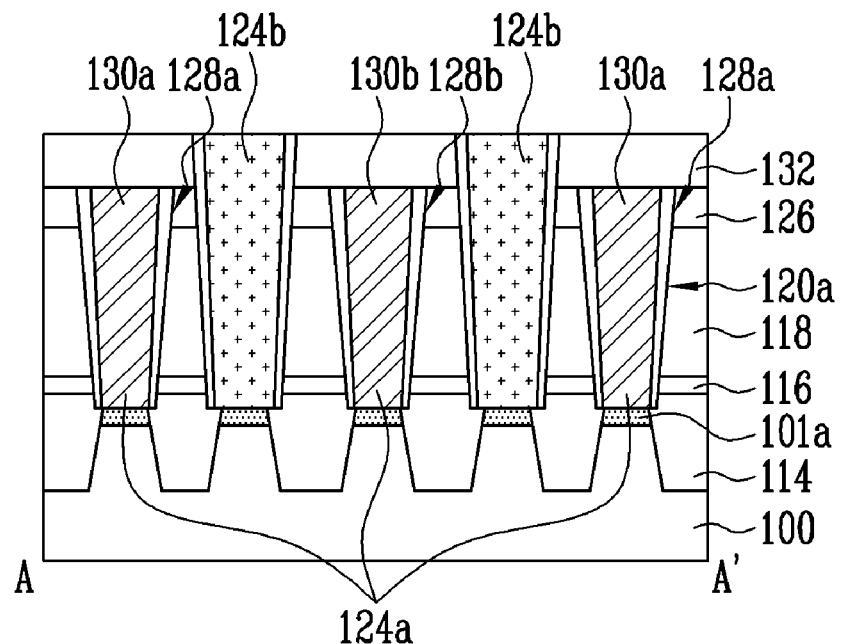
Figure 7E:
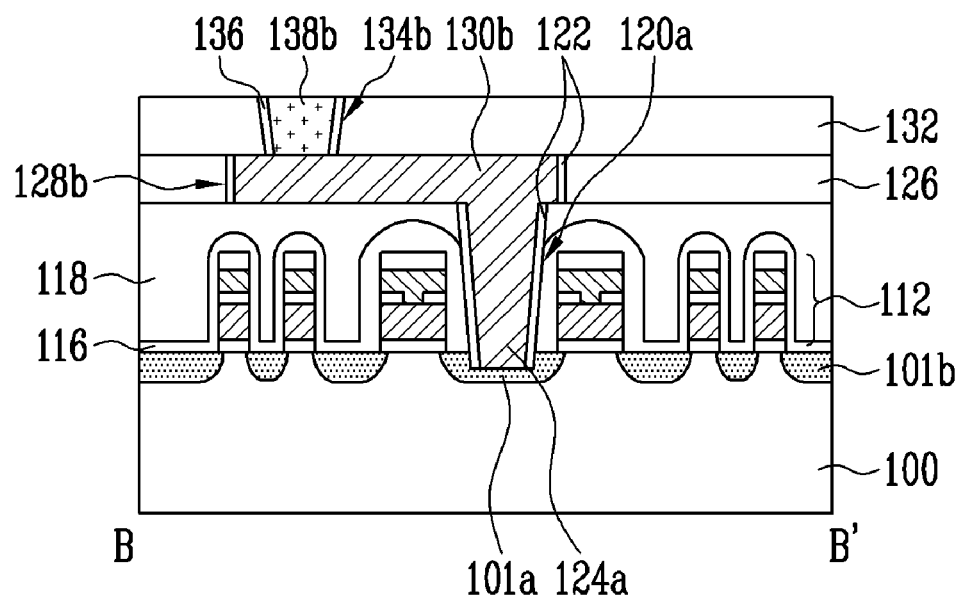
Figure 8E:
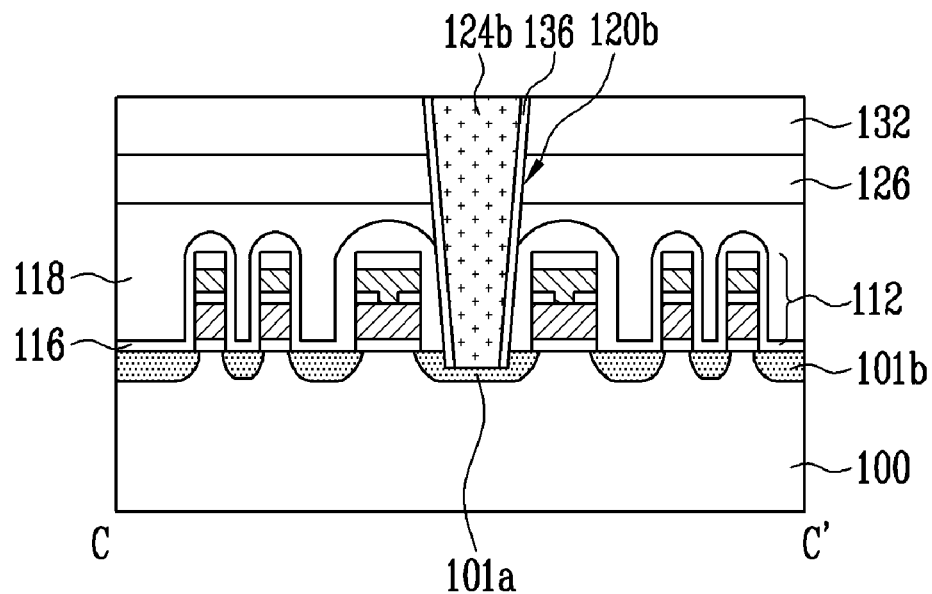

Referring to FIGS. 5E, 6E, 7E, and 8E, second contact plugs 124b are formed within the second contact holes 120b, and first and second pad contact plugs 138a, 138b are formed within the first and second pad contact holes 134a, 134b, respectively. The second contact plugs 124b and the first and second pad contact plugs 138a, 138b are identical to those of FIGS. 1E, 2E, 3E and 4E, and description thereof is omitted for simplicity.

Figure 5F:
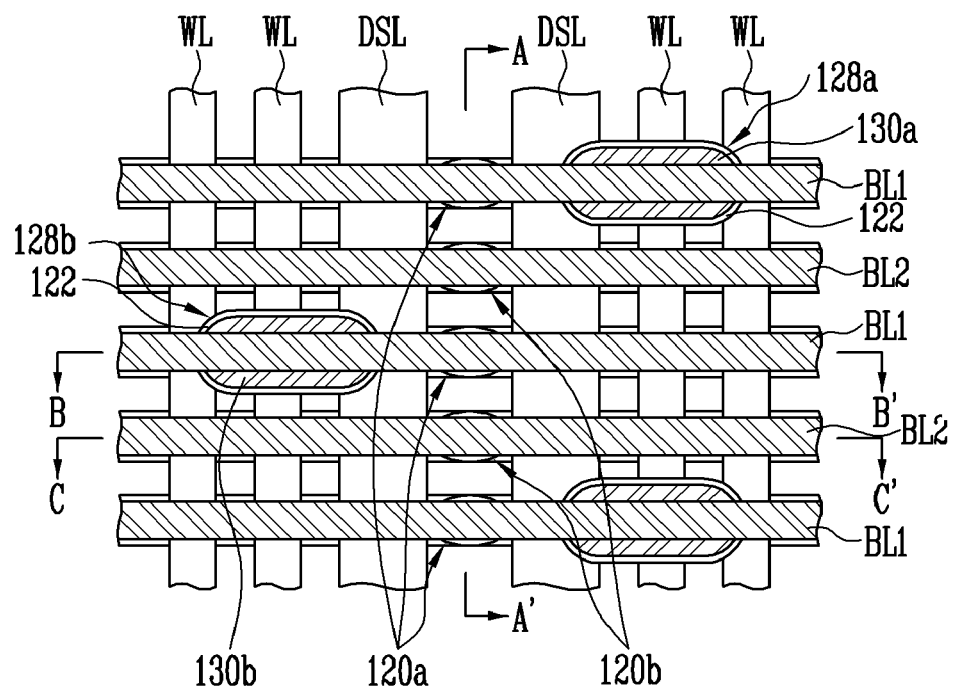
Figure 6F:
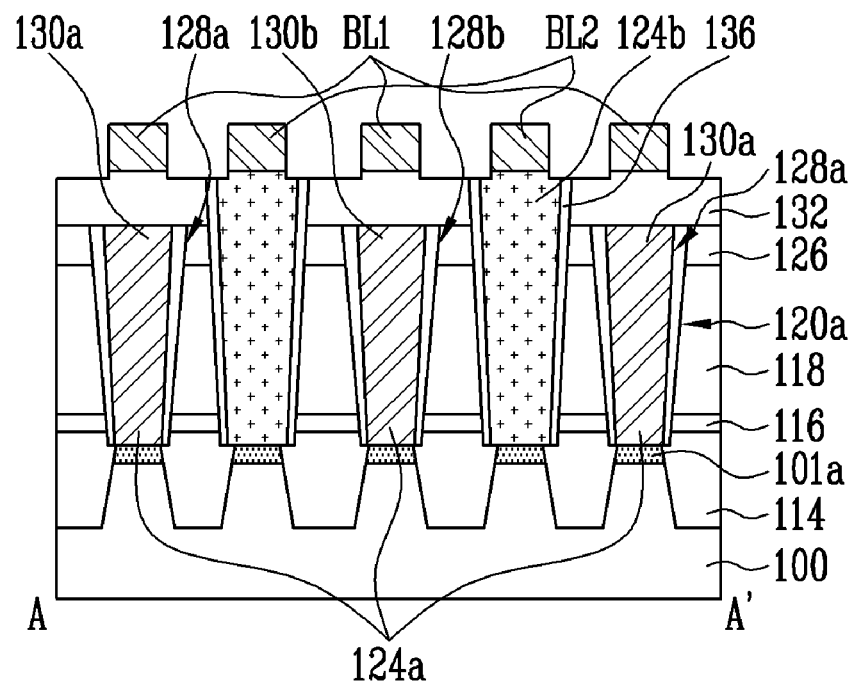
Figure 7F:
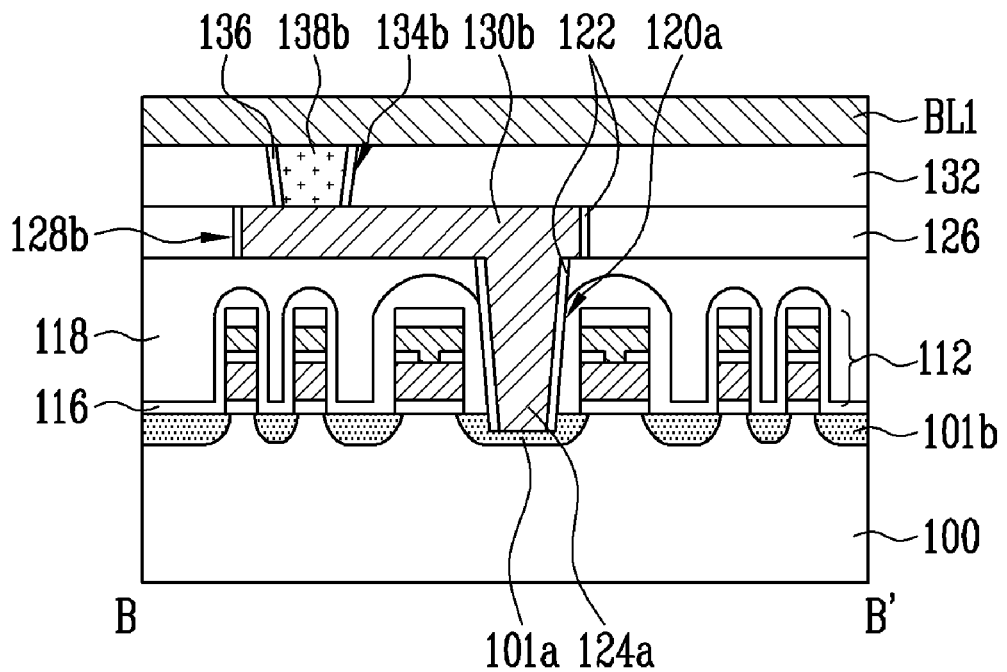
Figure 8F:
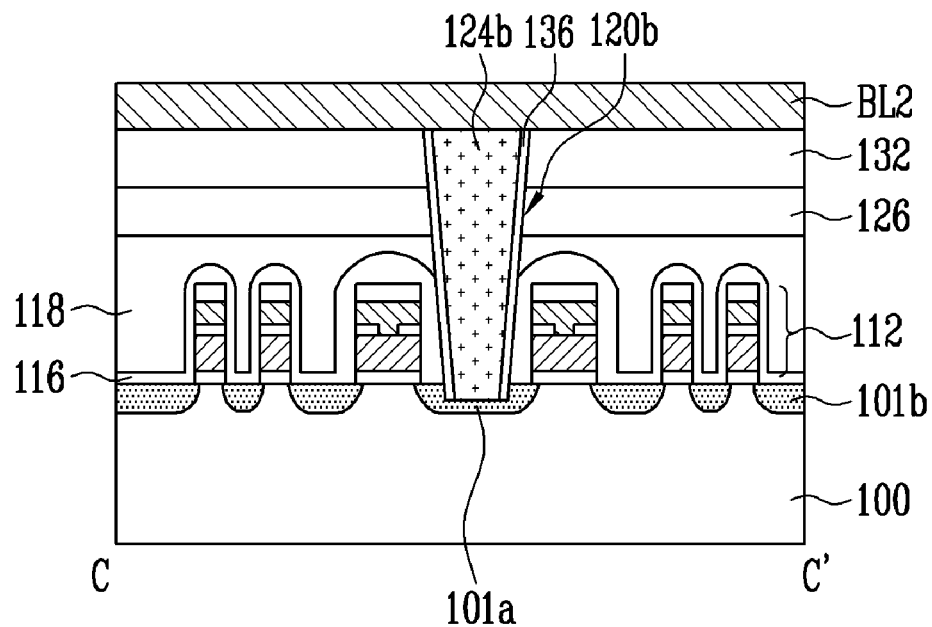

Referring to FIGS. 5F, 6F, 7F, and 8F, there are formed a plurality of first and second bit lines BL1, BL2. The first bit lines BL1 are connected to the first and second pad contact plugs 138a, 138b and intersect the drain select lines DSL. The second bit lines BL2 are connected to the second contact plugs 124b and intersect the drain select lines DSL. The first and second pad contact plugs 138a, 138b electrically connect the first and second conductive pads 130a, 130b and the first bit lines BL1. Thus, the first bit lines BL1 and the first drain areas of the first junctions 101a are electrically connected to each other. The second bit lines BL2 are electrically connected to the second drain areas of the first junctions 101a, through the second contact plug 124b. The first and second bit lines BL1, BL2 are identical to FIGS. 1F, 2F, 3F and 4F, and description thereof is omitted for simplicity. In accordance with the above description, the second embodiment of the invention can have the same effects as those of the first embodiment.

The invention can achieve one or more benefits including the following:

First, when contact holes are formed, the height of a pre-metal dielectric layer to be etched is reduced to the greatest extent. Accordingly, contact etch margin can be increased, a gap-fill characteristic of contact plugs can be improved due to a reduction in the aspect ratio of contact holes, and void formation in the contact plugs can be prevented.

Second, the first and second contact plugs 124a, 124b and first and second pad contact plugs 138a, 138b are formed with different heights and are disposed alternately. Accordingly, a bridge between neighboring contact plugs due to bowing can be prevented while sufficiently securing a bottom CD of the contact holes.

Third, a contact structure for connecting the bit lines and the junctions is divided into the contact plugs and the pad contact plugs, wherein conductive pads connected to the first contact plugs 124a are formed alternately. The first contact plugs 124a, and the pad contact plugs 138a, 138b are far from each other. Accordingly, a bridge between neighboring contact plugs can be prevented.

Fourth, a spacer can be formed on sidewalls of the contact holes. Accordingly, a bridge between the contact plugs due to void or defects, which occur when depositing a pre-metal dielectric layer, can be prevented.

Fifth, the bit lines share the contact holes one-to-one, but the bit lines and neighboring contact plugs are far from each other. Accordingly, it is advantageous to prevent the occurrence of a bridge between the bit lines and the contact plugs.

Sixth, a bottom CD of a contact hole having a relatively great aspect ratio can be secured while preventing a bridge between neighboring contact plugs. Accordingly, a failure in which the junctions under the contact holes are electrically not opened can be prevented.

Seventh, device failure can be reduced and the yield can be increased through the above effects.

The embodiments disclosed herein have been proposed to allow a person skilled in the art to easily implement the invention, and the person skilled in the art can implement the invention by a combination of these embodiments. Therefore, the scope of the invention is not limited by or to the embodiments as described above, and should be construed to be defined only by the appended claims and their equivalents.

What is claimed is:

1. A flash memory device comprising:
a semiconductor substrate having gate patterns;
first contact plugs formed on the semiconductor substrate between the gate patterns;
second contact plugs disposed alternately with the first contact plugs on the semiconductor substrate between the gate patterns, the second contact plugs having a height greater than the first contact plugs;
first and second conductive pads connected to the first contact plugs;
first and second pad contact plugs formed on extended edge portions of the first and second conductive pads;
first bit lines connected to the first and second pad contact plugs; and
second bit lines connected to the second contact plugs.

2. The flash memory device of claim 1, wherein the gate patterns form drain select lines.

3. The flash memory device of claim 1, wherein the first and second conductive pads are formed alternately and extend in opposite directions.

4. The flash memory device of claim 1, wherein the first and second conductive pads intersect the gate patterns and extend over word lines.

5. The flash memory device of claim 1, wherein a width of a portion of the first and second conductive pads connected to the first and second pad contact plugs is greater than a width of a portion of the first and second conductive pads connected to the first contact plugs.

6. The flash memory device of claim 1, wherein a height of the second contact plugs is substantially equal to a sum of a height of the first contact plug, a height of the first or second conductive pad, and a height of the first or second pad contact plug.

7. The flash memory device of claim 1 further comprising:
a first insulating layer in which first contact holes are formed to define areas in which the first contact plugs are to be formed;
a second insulating layer in which first and second pad holes are formed to define areas in which the first and second conductive pads are to be formed; and a third insulating layer in which first and second pad contact holes are formed to define areas in which the first and second pad contact plugs are to be formed.

8. The flash memory device of claim 7, wherein the second contact plugs are formed within second contact holes extending through the first, second, and third insulating layers.

9. The flash memory device of claim 8 further comprising a spacer on sidewalls of any one of the first contact holes and, the second contact holes.

10. The flash memory device of claim 9, wherein the spacer is formed from a material having an etch selectivity different than an etch selectivity of the first, second, and third insulating layers.

11. The flash memory device of claim 10, wherein the spacer is formed of nitride-based material.

12. The flash memory device of claim 1, wherein the first and second contact plugs are connected to drain junctions formed on the semiconductor substrate between the gate patterns.

* * * * *